(12) United States Patent
Huang et al.

(10) Patent No.: US 10,868,182 B2
(45) Date of Patent: Dec. 15, 2020

(54) FIELD EFFECT TRANSISTOR AND MANUFACTURING METHOD THEREOF

(71) Applicant: Taiwan Semiconductor Manufacturing Co., Ltd., Hsinchu (TW)

(72) Inventors: Yu-Xuan Huang, Hsinchu (TW); Ching-Wei Tsai, Hsinchu (TW); Kuan-Lun Cheng, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 92 days.

(21) Appl. No.: 16/164,765

(22) Filed: Oct. 18, 2018

(65) Prior Publication Data

US 2020/0044071 A1  Feb. 6, 2020

Related U.S. Application Data

(60) Provisional application No. 62/712,239, filed on Jul. 31, 2018.

(51) Int. Cl.
| | | |
|---|---|---|
| *H01L 29/78* | (2006.01) | |
| *H01L 21/768* | (2006.01) | |
| *H01L 23/48* | (2006.01) | |
| *H01L 29/08* | (2006.01) | |
| *H01L 29/66* | (2006.01) | |
| *G06F 30/398* | (2020.01) | |

(52) U.S. Cl.
CPC .......... *H01L 29/785* (2013.01); *G06F 30/398* (2020.01); *H01L 21/76816* (2013.01); *H01L 23/481* (2013.01); *H01L 29/0847* (2013.01); *H01L 29/66545* (2013.01); *H01L 29/66795* (2013.01)

(58) Field of Classification Search
CPC ......... H01L 21/76816; H01L 21/76897; H01L 21/823821; H01L 27/0886; H01L 27/0924; H01L 29/41791; H01L 29/66795; H01L 29/785; H01L 23/481; H01L 23/485; G06F 30/39; G06F 30/398
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

*Primary Examiner* — David C Spalla
(74) *Attorney, Agent, or Firm* — JCIPRNET

(57) ABSTRACT

A field effect transistor (FET) including a substrate, a plurality of insulators, a gate stack, a first strained material, a second strained material, a first conducive via, a second conductive via, and a silicide layer. The substrate includes a plurality of trenches and at least one semiconductor fin between the trenches. The insulators are in the trenches. The gate stack is disposed over the semiconductor fins and on the insulators. The first strained material is located on one side of the gate stack and the second strained material is located on another side of the gate stack. The first conductive via is electrically connected to the first strained material and the second conductive via is electrically connected to the second strained material. The silicide layer contacts the first strained material and the first conductive via and contacts the second strained material and the second conductive via.

20 Claims, 25 Drawing Sheets

(56) References Cited

U.S. PATENT DOCUMENTS

| | | |
|---|---|---|
| 8,816,444 B2 * | 8/2014 | Wann .................. H01L 27/0207 |
| | | 257/401 |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,768,062 B1 * | 9/2017 | Kittl .................. H01L 21/76846 |

* cited by examiner

FIELD EFFECT TRANSISTOR AND MANUFACTURING METHOD THEREOF

CROSS-REFERENCE TO RELATED APPLICATION

This application claims the priority benefits of U.S. provisional application Ser. No. 62/712,239, filed on Jul. 31, 2018. The entirety of the above-mentioned patent application is hereby incorporated by reference herein and made a part of this specification.

BACKGROUND

As the semiconductor devices keeps scaling down in size, three-dimensional multi-gate structures, such as the fin field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
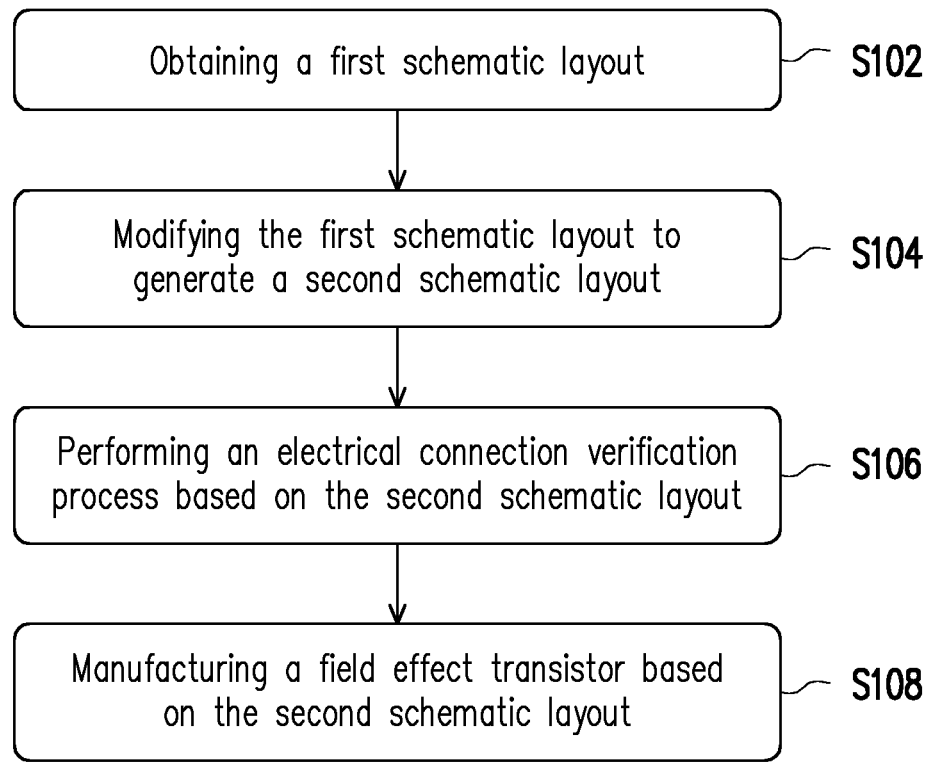
FIG. 1 is a flow chart illustrating a manufacturing method of a field effect transistor (FET) in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2A:
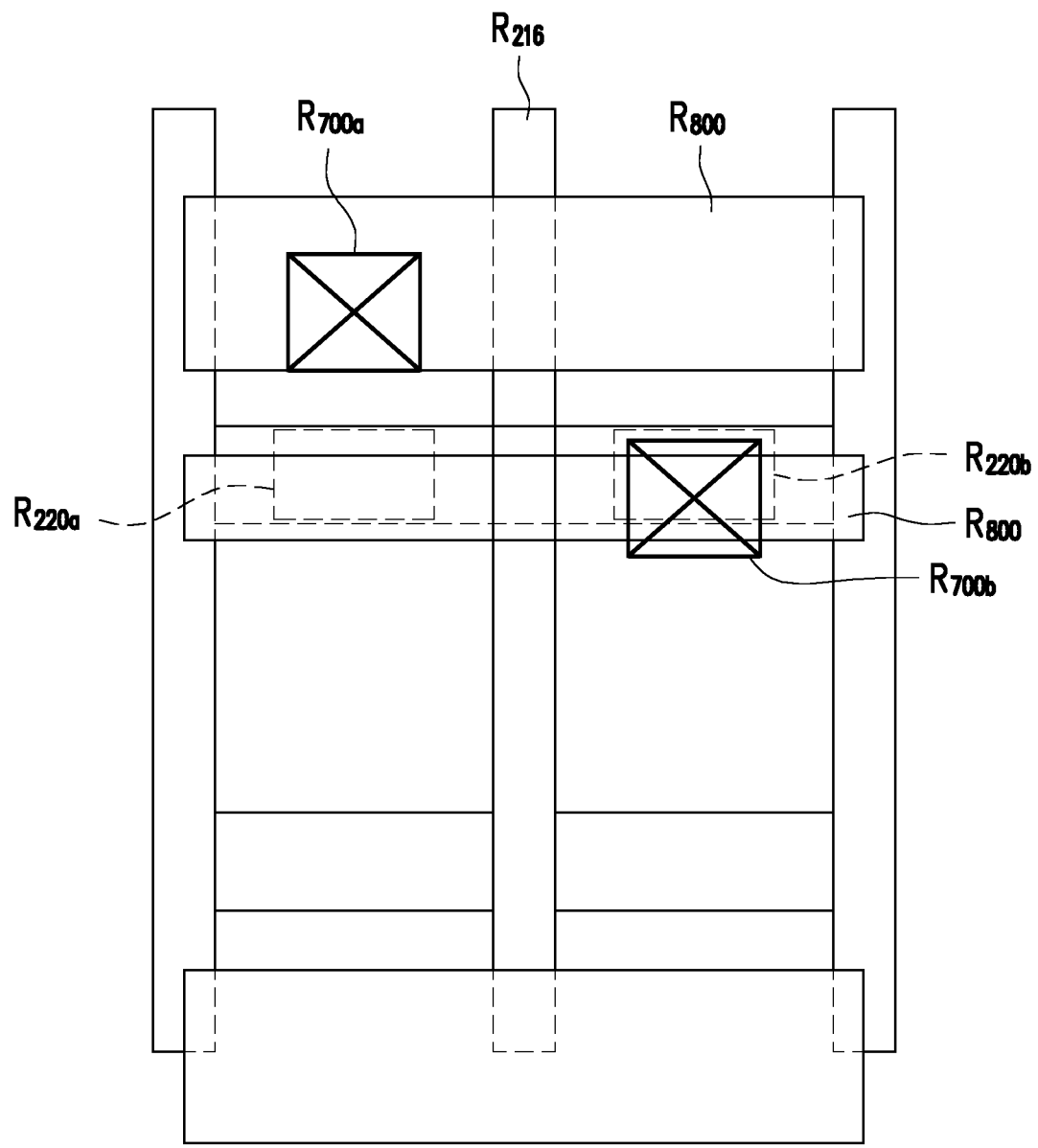
FIG. 2A to FIG. 2B are schematic layouts of the FET adapted in the manufacturing method shown in FIG. 1.
Figure 2B:
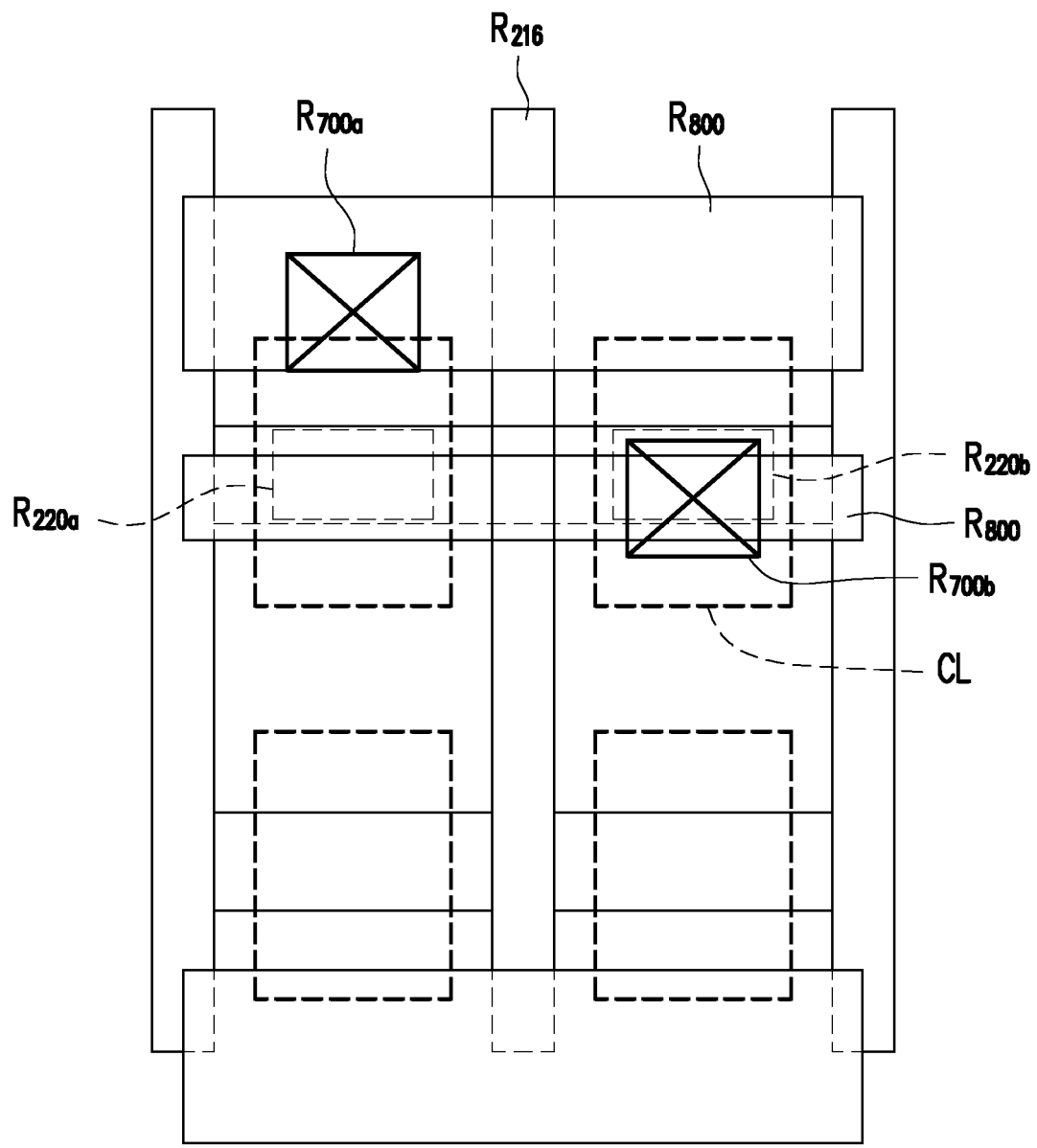

FIG. 1 is a flow chart illustrating a manufacturing method of a field effect transistor (FET) 10 in accordance with some embodiments of the disclosure. FIG. 2A to FIG. 2B are schematic layouts of the FET 10 adapted in the manufacturing method shown in FIG. 1. Referring to FIG. 1, in step S102, a first schematic layout of the FET 10 is obtained. In some embodiments, the schematic layout shown in FIG. 2A corresponds to the first schematic layout. Referring to FIG. 2A, the first schematic layout includes a gate region $R_{216}$, a source region $R_{220a}$ of a semiconductor fin, a drain region $R_{220b}$ of the semiconductor fin, a first conductive via region $R_{700a}$, a second conductive via region $R_{700b}$, and a routing pattern region $R_{800}$. In some embodiments, an extending direction of the semiconductor fin is perpendicular to an extending direction of the gate region $R_{216}$. In other words, the source region $R_{220a}$ and the drain region $R_{220b}$ are located on two opposite sides of the gate region $R_{216}$. In some embodiments, the first conductive via region $R_{700a}$, the second conductive via region $R_{700b}$, and the routing pattern region $R_{800}$ are located above the source region $R_{220a}$, the drain region $R_{220b}$, and the gate region $R_{216}$. As illustrated in FIG. 2A, from the top view of the first schematic layout, the second conductive via region $R_{700b}$ is overlapped with both of the drain region $R_{220b}$ and the routing pattern region $R_{800}$. On the other hand, the first conductive via region $R_{700a}$ is not overlapped with the source region $R_{220a}$ of the semiconductor fin. From the electrical connection point of view, the source region $R_{220a}$ of the semiconductor fin is electrically insulated from the routing pattern region $R_{800}$ while the drain region $R_{220b}$ of the semiconductor fin is electrically connected to the routing pattern region $R_{800}$ through the second conductive via region $R_{700b}$.

It should be noted that the first schematic layout shown in FIG. 2A is merely an exemplary illustration, and the disclosure is not limited thereto. In some alternative embodiments, the second conductive via region $R_{700b}$ may be shown as not overlapped with the drain region $R_{220b}$ of the semiconductor fin. In some embodiments, the first conductive via region $R_{700a}$ or the second conductive region $R_{700b}$ is not overlapped with the source region $R_{220a}$, the drain region $R_{220b}$, and/or the routing pattern region $R_{800}$.

In some embodiments, during the layout designing process, an electronic design automation (EDA) verification software may be adapted to verify whether a particular integrated circuit layout corresponds to the original schematic or circuit diagram of the design. In other words, the EDA verification software may be utilized to verify the electrical connection among components in the schematic layout. In some embodiments, the EDA verification software may include a layout versus schematic (LVS) tool. As mentioned above, in FIG. 2A, the first conductive via region $R_{700a}$ is not overlapped with the source region $R_{220a}$ of the semiconductor fin, and the first conductive via region $R_{700a}$ is electrically insulated from the routing pattern region $R_{800}$. Therefore, upon feeing the first schematic layout into the EDA verification software, the electrical connection verification would not pass, thereby fail to comply with the design rule. To bypass the EDA verification software, in step S104, a modification process is performed on the first schematic layout to generate a second schematic layout. In some embodiments, the schematic layout shown in FIG. 2B corresponds to the second schematic layout. Referring to FIG. 2B, a plurality of faker contact layers (FCL) CL is generated on the second schematic layout. One of the faker contact layer CL is overlapped with both of the source region $R_{220a}$ of the semiconductor fin and the first conductive via region $R_{700a}$ and another one of the faker contact layer CL is overlapped with both of the drain region $R_{220b}$ of the semiconductor fin and the second conductive via region $R_{700b}$. In some embodiments, the faker contact layers CL may be completely or partially overlapped with the source region $R_{220a}$ and the drain region $R_{220b}$ of the semiconductor fin. Similarly, the fake contact layers CL may be completely or partially overlapped with the first conductive via region $R_{700a}$ and the second conductive via region $R_{700b}$. In some embodiments, the same faker contact layer CL is not overlapped with both of the source region $R_{220a}$ and the drain region $R_{220b}$ of the semiconductor fin simultaneously. In other words, each faker contact layer CL is only overlapped with one of the source region $R_{220a}$ and the drain region $R_{220b}$. In some embodiments, different types of FET devices may be incorporated into a same schematic layout. For example, a p-type FET and an n-type FET may be shown on the same schematic layout. Under this scenario, the faker contact layer CL is not overlapped with both of the p-type FET and the n-type FET simultaneously. In other words, each faker contact layer CL is either overlapped with the source/drain regions of the p-type FET or overlapped with the source/drain regions of the n-type FET.

Although more than one faker contact layers CL are generated to obtain the second schematic layout shown in FIG. 2B, the disclosure is not limited thereto. The number and the location of the faker contact layer CL may be adjusted based on the deficiencies of the first schematic layout.

In step S106, after the second schematic layout is obtained, an electrical connection verification process is performed based on the second schematic layout. In some embodiments, the electrical connection verification process may be performed by the EDA verification software. For example, the EDA verification software may be adapted to determine whether the source region $R_{220a}$ and/or the drain region $R_{220b}$ is electrically connected to the routing pattern region $R_{800}$. In some embodiments, the determination of the electrical connection may be realized through measuring an input and an output based on the EDA verification software. For example, the supply voltage (Vss and/or Vdd) of the system may be measured to verify the electrical connection among components within the second schematic layout.

In some embodiments, by generating faker contact layer CL in the second schematic layout, the input and the output may be accurately measured by the EDA verification software. For example, in the algorithm of the EDA verification software, the source region $R_{220a}$ of the semiconductor fin may be electrically connected to the routing pattern region $R_{800}$ sequentially through the faker contact layer CL and the first conductive via region $R_{700a}$. Similarly, from the perspective of the EDA verification software, the drain region $R_{220b}$ of the semiconductor fin may be electrically connected to the routing pattern region $R_{800}$ sequentially through the faker contact layer CL and the second conductive via region $R_{700b}$. With the aid of the faker contact layer CL, the second schematic layer is able to bypass the EDA verification software and the design rule of the product may be fulfilled.

Upon ensuring the electrical connection of the components within the second schematic layout based on the results generated from the EDA verification software, in step S108, a FET 10 is manufactured based on the second schematic layout. The detailed description of the manufacturing process of the FET 10 will be presented below in conjunction with FIG. 5A to FIG. 5N and FIG. 6A to FIG. 6N. It should be noted that in the manufacturing process of the FET 10, the faker contact layer CL is not formed. In other words, the faker contact layer CL does not exist in the FET 10 and only exists in the schematic layout.

Figure 3:
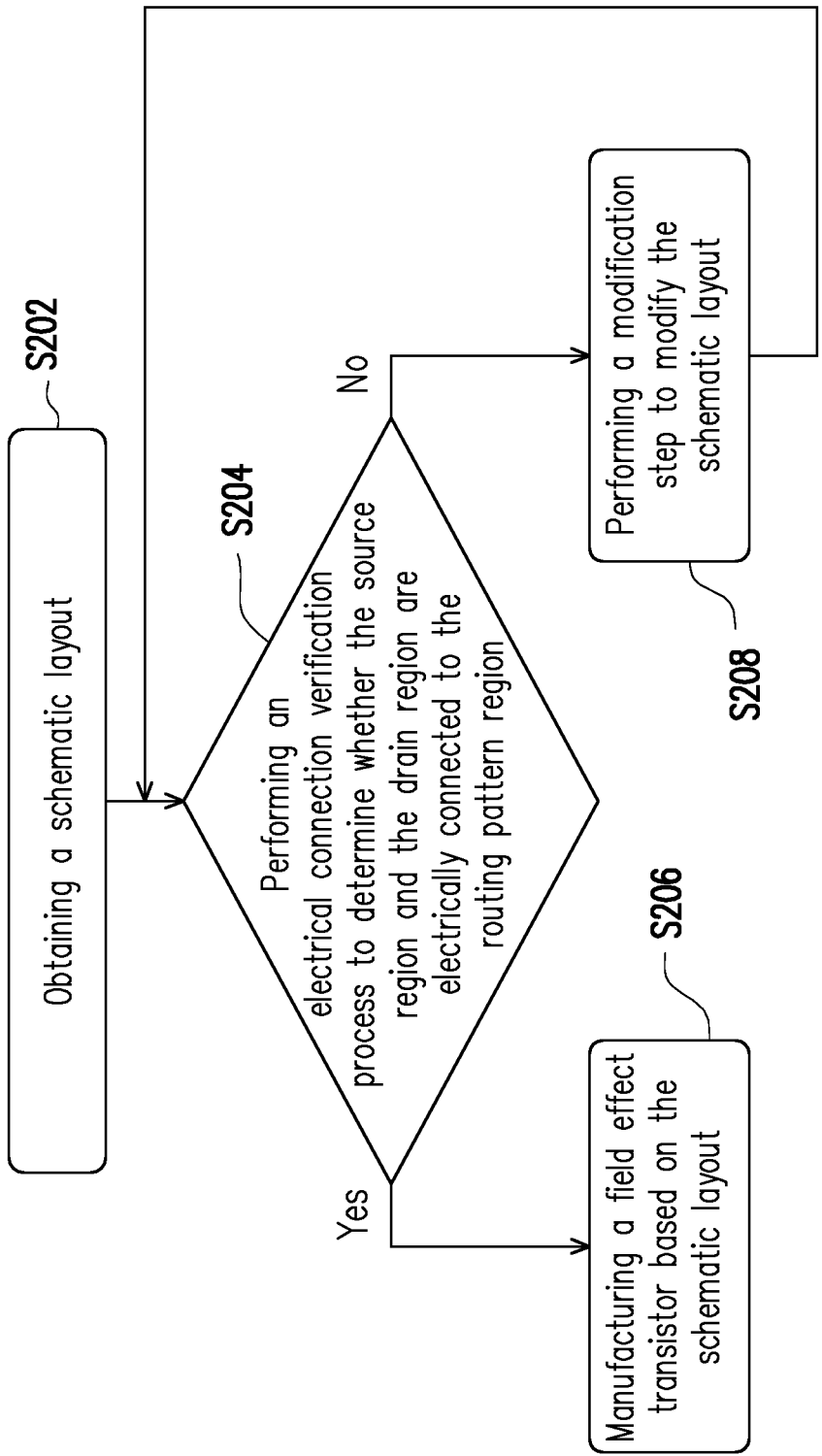
FIG. 3 is a flow chart illustrating a manufacturing method of a FET in accordance with some alternative embodiments of the disclosure.
Figure 4A:
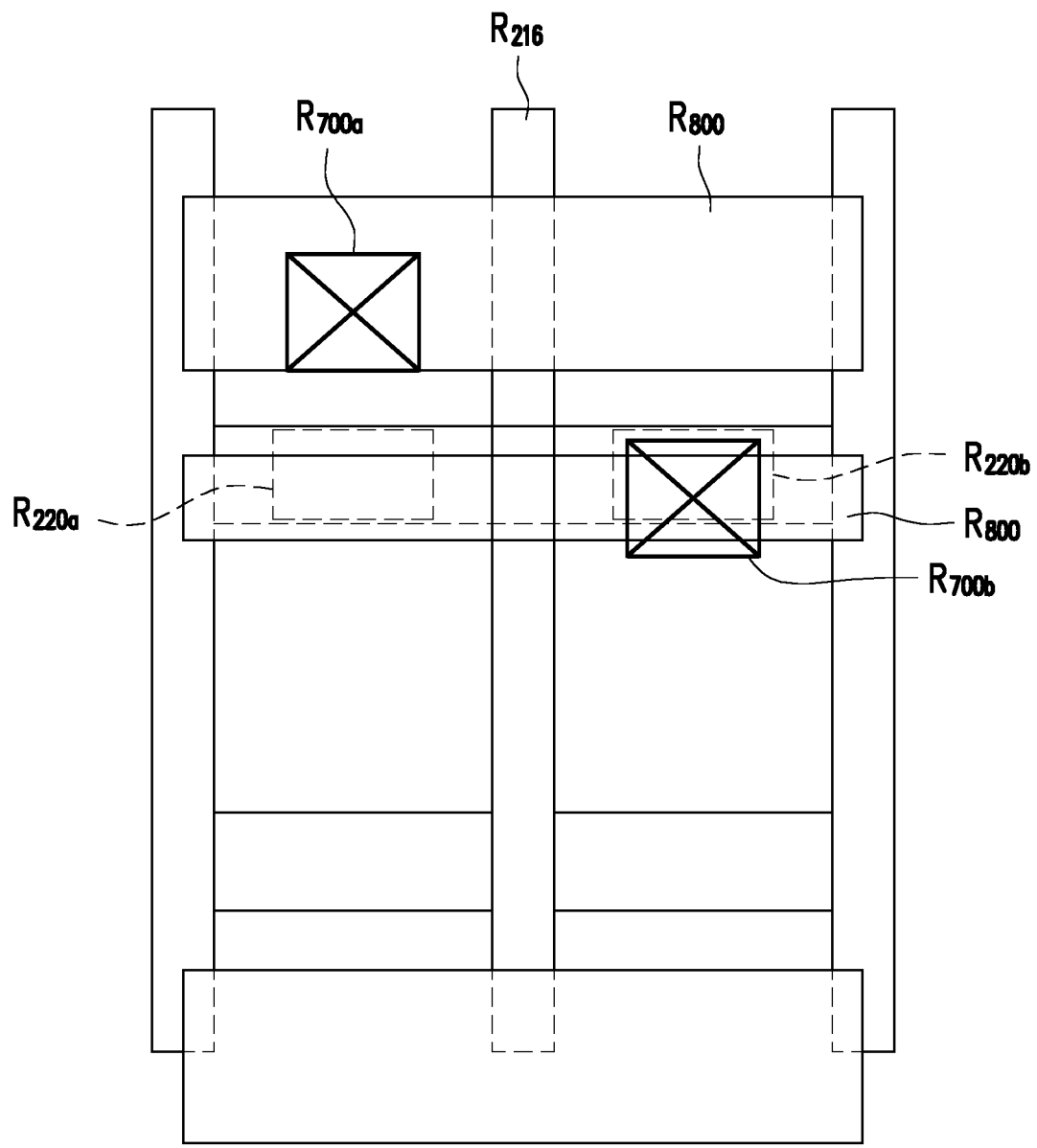
FIG. 4A to FIG. 4C are schematic layouts of the FET adapted in the manufacturing method shown in FIG. 3.
Figure 4B:
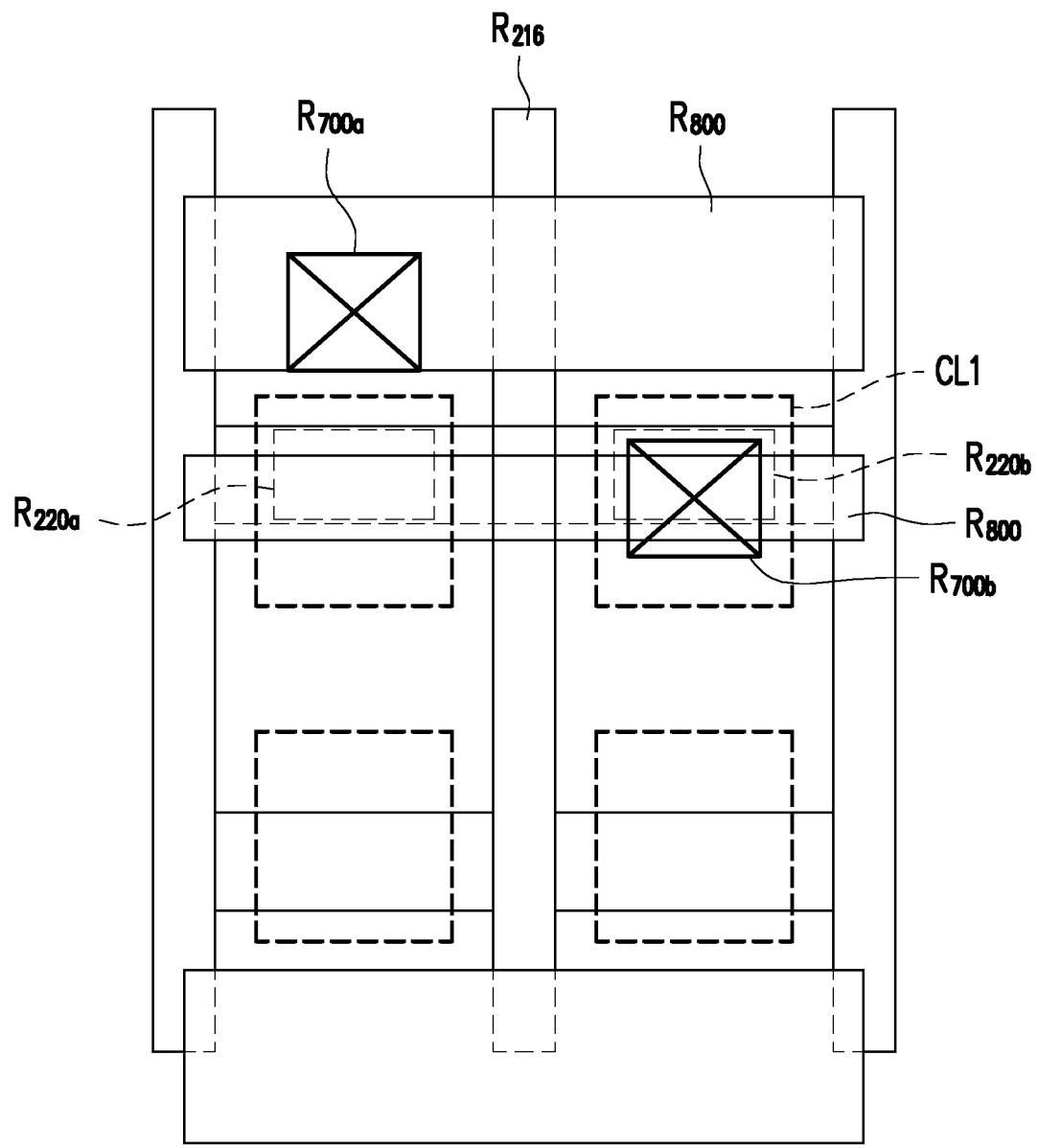
Figure 4C:
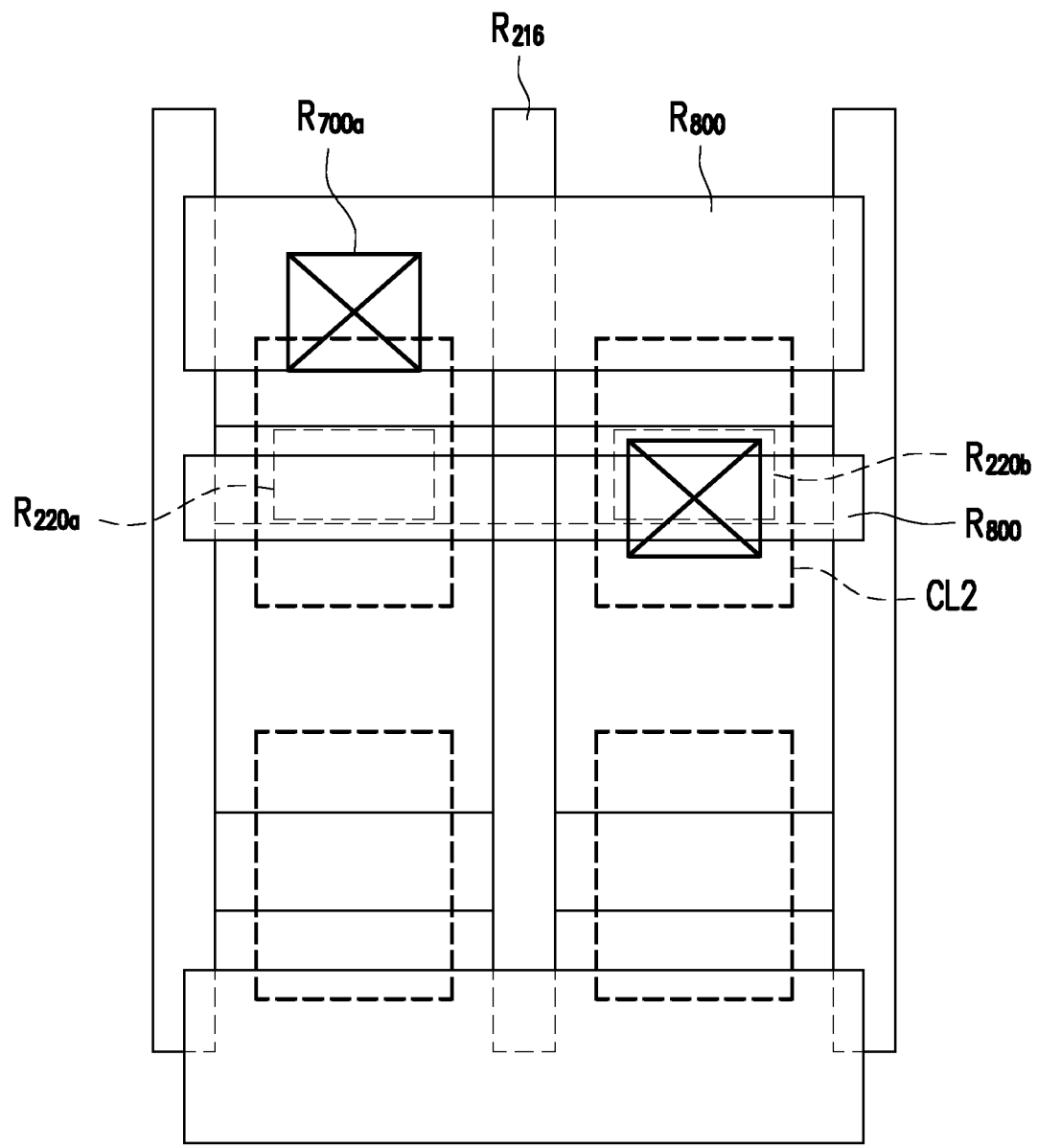

FIG. 3 is a flow chart illustrating a manufacturing method of a FET 10 in accordance with some alternative embodiments of the disclosure. FIG. 4A to FIG. 4C are schematic layouts of the FET 10 adapted in the manufacturing method shown in FIG. 3. Referring to FIG. 3, in step S202, a first schematic layout of the FET 10 is obtained. In some embodiments, the schematic layout shown in FIG. 4A corresponds to the first schematic layout. The first schematic layout shown in FIG. 4A may be similar to the first schematic layout shown in FIG. 2A, so the detailed description thereof is omitted herein.

In step S204, a first electrical connection verification process is performed based on the first schematic layout to determine whether the source region $R_{220a}$ and the drain region $R_{220b}$ are electrically connected to the routing pattern region $R_{800}$. In some embodiments, the determination may be executed by the EDA verification software. In response to a first condition when the source region $R_{220a}$ and the drain region $R_{220b}$ are determined to be electrically connected to the routing pattern region $R_{800}$ based on the first electrical connection verification process, step S206 is performed. In step S206, the FET 10 may be manufactured based on the verified first schematic layout. However, if the constraints of the first condition are not satisfied, further modification is performed on the first schematic layout. For example, in response to a second condition when the source region $R_{220a}$ and/or the drain region $R_{220b}$ is determined to be electrically insulated from the routing pattern region $R_{800}$ based on the first electrical connection verification process, step S208 is performed. In step S208, a modification step is performed to modify the first schematic layout to generate a second schematic layout.

Referring to FIG. 4A, since the source region $R_{220a}$ is not overlapped with the first conductive via region $R_{700a}$ and is electrically insulated from the routing pattern region $R_{800}$, the first schematic layout show in FIG. 4A would result in the second condition. Therefore, the first schematic layout in FIG. 4A is modified to obtain the second schematic layout show in FIG. 4B. Referring to FIG. 4B, a plurality of first faker contact layers CL1 is generated on the second schematic layout. As illustrated in FIG. 4B, the first faker contact layers CL1 are overlapped with the source region $R_{220a}$ of the semiconductor fin, the drain region $R_{220b}$ of the semiconductor fin, and the second conductive via region $R_{700b}$. However, the first faker contact layers CL1 are not overlapped with the first conductive via region $R_{700a}$. From the electrical connection point of view, the source region $R_{220a}$ of the semiconductor fin is electrically insulated from the routing pattern region $R_{800}$ while the drain region $R_{220b}$ of the semiconductor fin is electrically connected to the routing pattern region $R_{800}$ sequentially through the first faker contact layer CL1 and the second conductive via region $R_{700b}$.

After the second schematic layout is obtained, step S204 may be performed again. In other words, a second electrical connection verification process is performed based on the second schematic layout to determine whether the source region $R_{220a}$ and the drain region $R_{220b}$ are electrically connected to the routing pattern region $R_{800}$. In some embodiments, the second electrical connection verification process may be executed by the EDA verification software. In response to a third condition when the source region $R_{220a}$ and the drain region $R_{220b}$ are determined to be electrically connected to the routing pattern region $R_{800}$ based on the second electrical connection verification process, step S206 is performed. In step S206, the FET 10 may be manufactured based on the verified second schematic layout. However, if the constraints of the third condition are not satisfied, further modification is performed on the second schematic layout. For example, in response to a fourth condition when the source region $R_{220a}$ and/or the drain region $R_{220b}$ is determined to be electrically insulated from the routing pattern region $R_{800}$ based on the second electrical connection verification process, step S208 is performed. In step S208, a modification step is performed to modify the second schematic layout to generate a third schematic layout.

Referring to FIG. 4B, since the first faker contact layer CL is not overlapped with the first conductive via region $R_{700a}$ and the source region $R_{220a}$ is electrically insulated from the routing pattern region $R_{800}$, the second schematic layout show in FIG. 4B would result in the fourth condition. Therefore, the second schematic layout in FIG. 4B is modified to obtain the third schematic layout show in FIG. 4C. Referring to FIG. 4C, a plurality of second faker contact layers CL2 is generated on the third schematic layout to replace the first faker contact layers CL1 in the second schematic layout. The second faker contact layers CL2 of FIG. 4C may be similar to the faker contact layers CL of FIG. 2B, so the detailed descriptions thereof are omitted herein. One of the second faker contact layer CL2 is overlapped with both of the source region $R_{220a}$ of the semiconductor fin and the first conductive via region $R_{700a}$ and another one of the second faker contact layer CL2 is overlapped with both of the drain region $R_{220b}$ of the semiconductor fin and the second conductive via region $R_{700b}$.

After the third schematic layout is obtained, step S204 may be performed again. In other words, a third electrical connection verification process is performed based on the third schematic layout to determine whether the source region $R_{220a}$ and the drain region $R_{220b}$ are electrically connected to the routing pattern region $R_{800}$. In some embodiments, the third electrical connection verification process may be executed by the EDA verification software.

In response to a fifth condition when the source region $R_{220a}$ and the drain region $R_{220b}$ are determined to be electrically connected to the routing pattern region $R_{800}$ based on the third electrical connection verification process, step S206 is performed. In step S206, the FET 10 may be manufactured based on the verified third schematic layout. In some embodiments, the third schematic layout shown in FIG. 4C would result in the fifth condition. For example, in the algorithm of the EDA verification software, the source region $R_{220a}$ of the semiconductor fin may be electrically connected to the routing pattern region $R_{800}$ sequentially through the second faker contact layer CL2 and the first conductive via region $R_{700a}$. Similarly, from the perspective of the EDA verification software, the drain region $R_{220b}$ of the semiconductor fin may be electrically connected to the routing pattern region $R_{800}$ sequentially through the second faker contact layer CL2 and the second conductive via region $R_{700b}$. In other words, the source region $R_{220a}$ and/or the drain region $R_{220b}$ is determined to be electrically connected to the routing pattern region $R_{800}$ through the second faker contact layer CL2. It should be noted that in the manufacturing process of the FET 10, the second faker contact layer CL2 is not formed. In other words, the second faker contact layer CL2 does not exist in the FET 10 and only exists in the schematic layout.

However, if the constraints of the fifth condition are not satisfied, further modification is performed on the third schematic layout. For example, in response to a sixth condition when the source region $R_{220a}$ and the drain region $R_{220b}$ are determined to be electrically insulated from the routing pattern region $R_{800}$ based on the third electrical connection verification process, the foregoing steps (steps S208, S204, and S206) may be iteratively performed until the source region $R_{220a}$ and the drain region $R_{220b}$ are determined to be electrically connected to the routing pattern region $R_{800}$. Thereafter, the FET 10 may be manufactured based on the verified schematic layout.

Figure 5A:
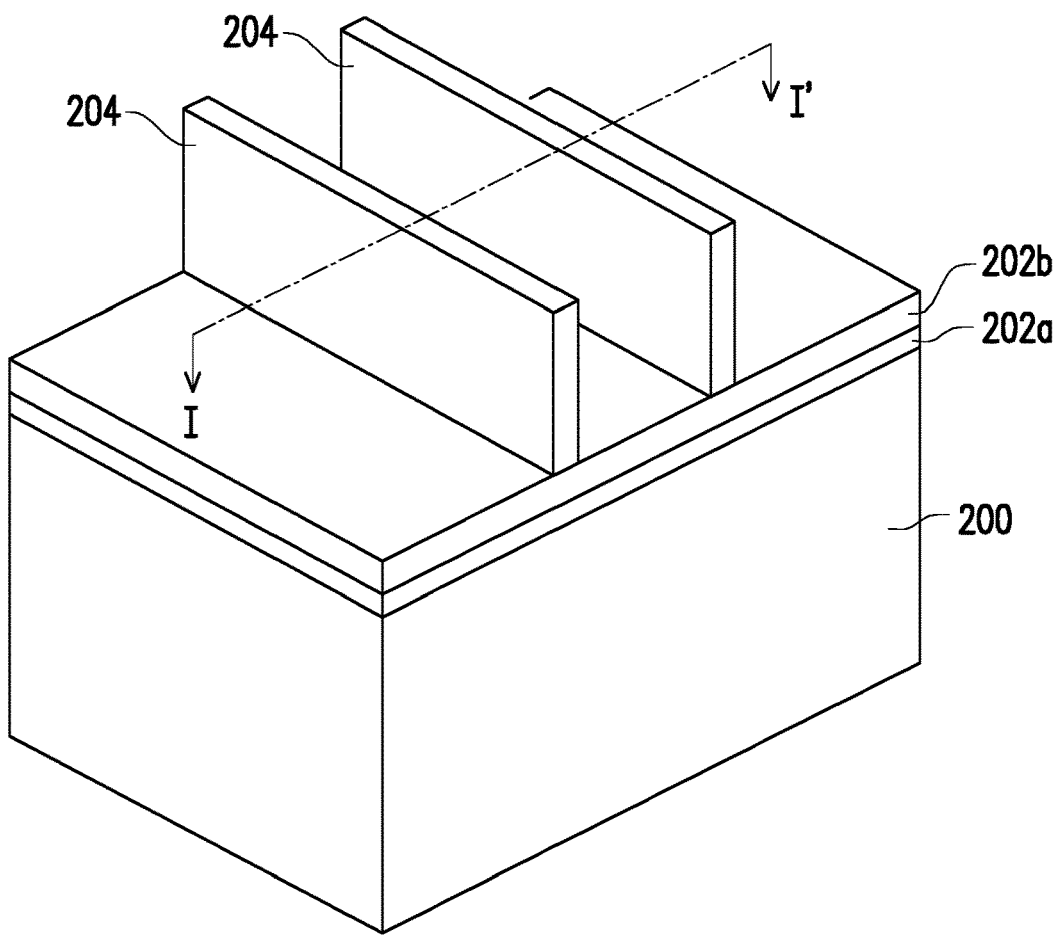
FIG. 5A to FIG. 5N are perspective views illustrating a manufacturing method of a FET in accordance with some embodiments of the disclosure.
Figure 6A:
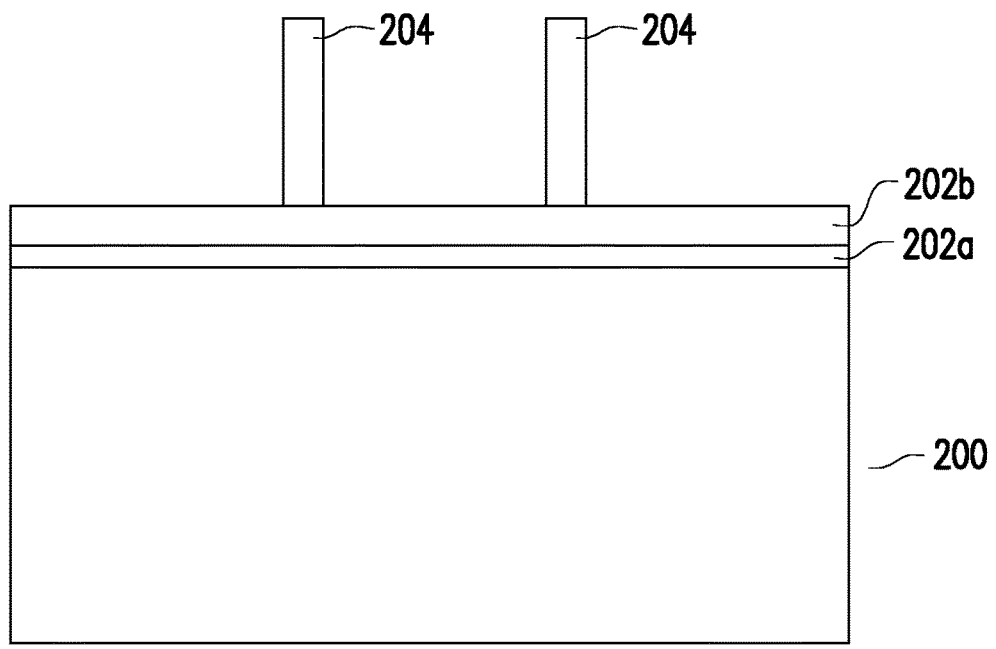
FIG. 6A to FIG. 6N are cross-sectional views of FIG. 5A to FIG. 5N.
Figure 5B:
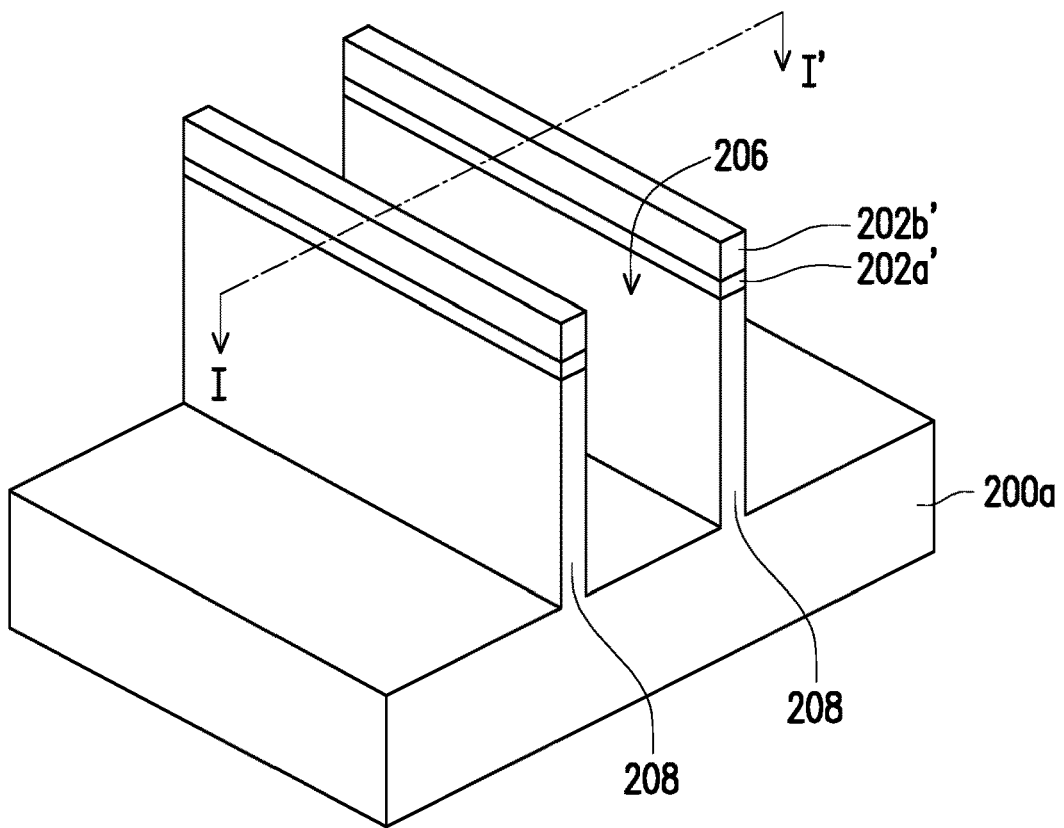
Figure 5C:
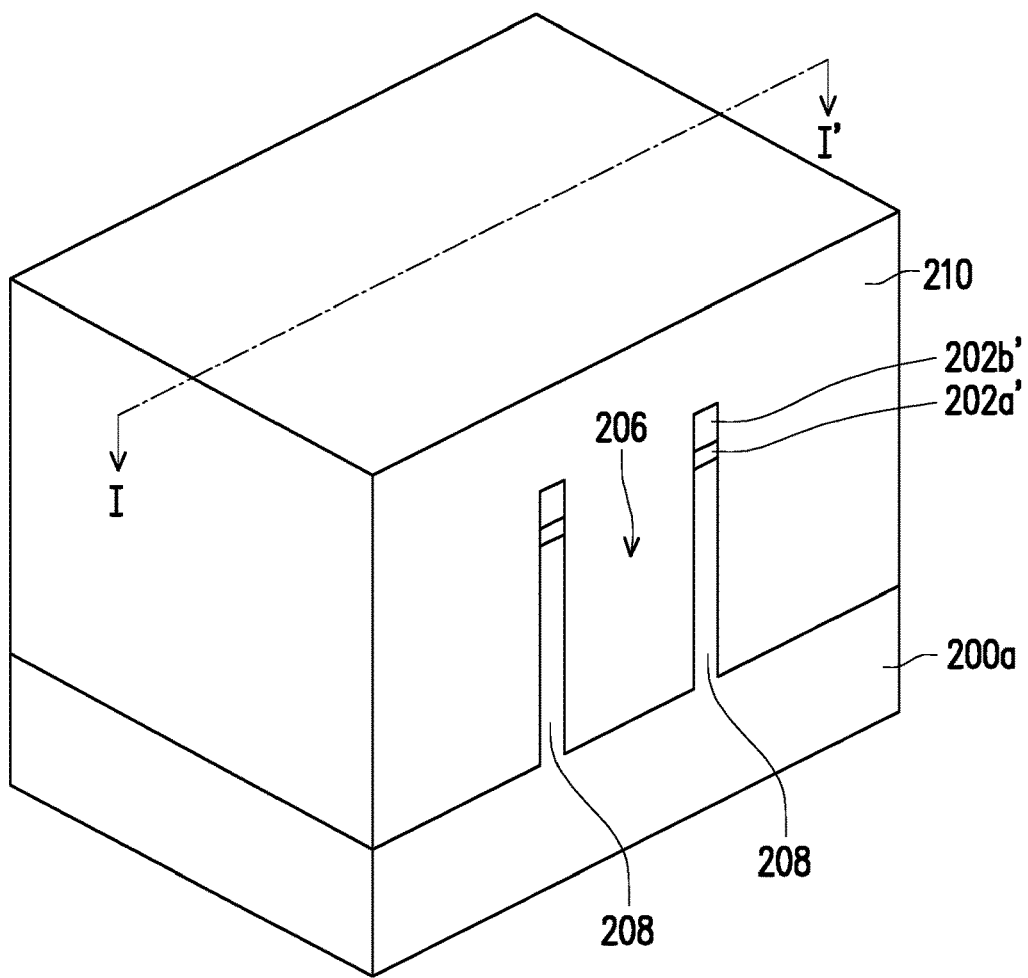
Figure 5D:
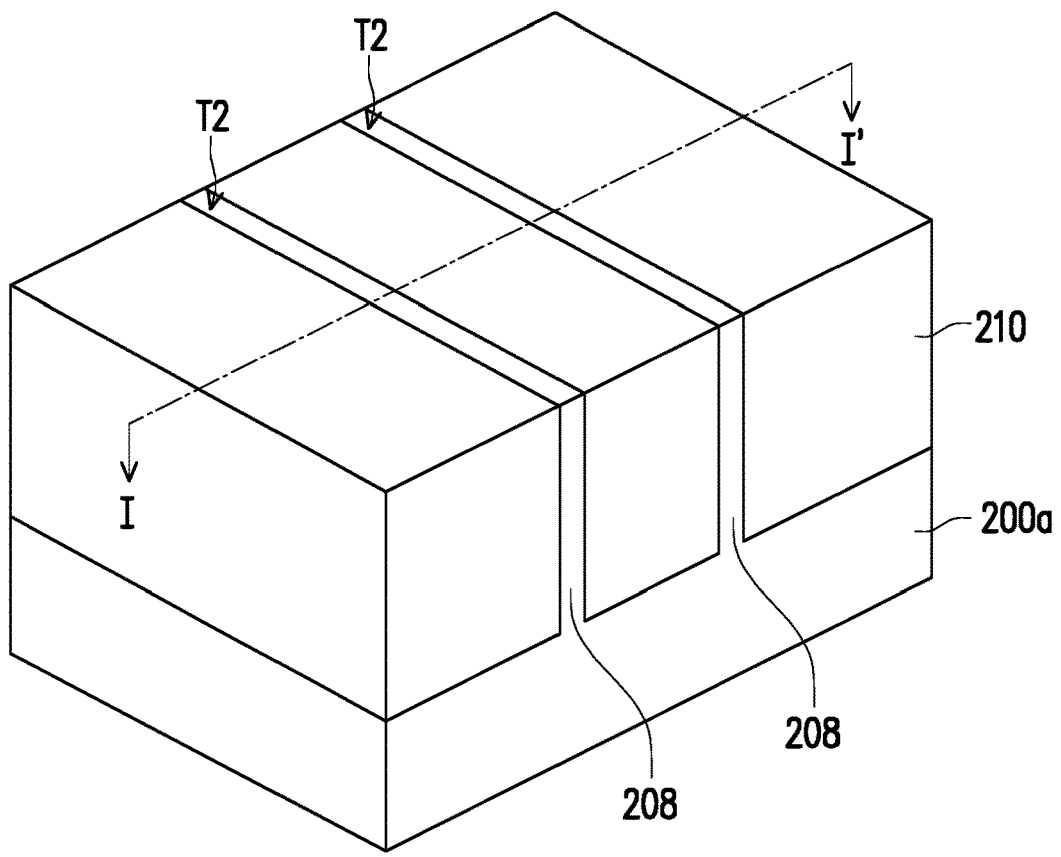
Figure 5E:
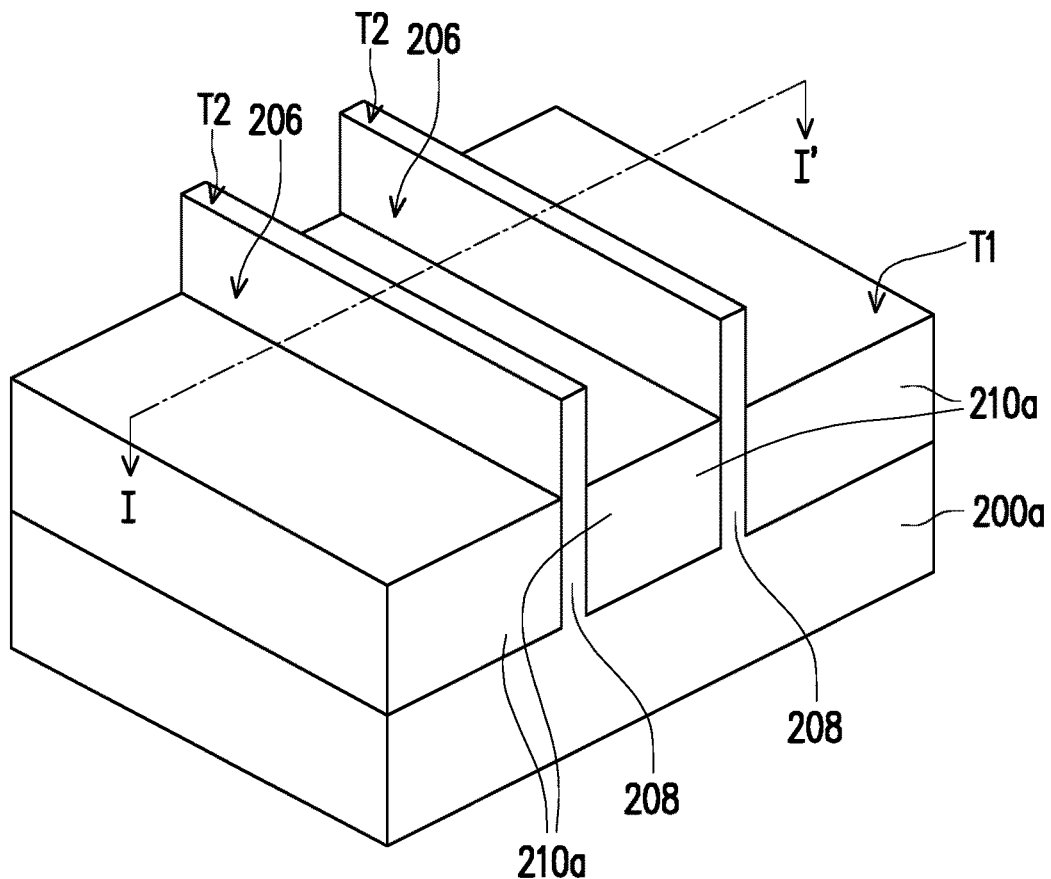
Figure 5F:
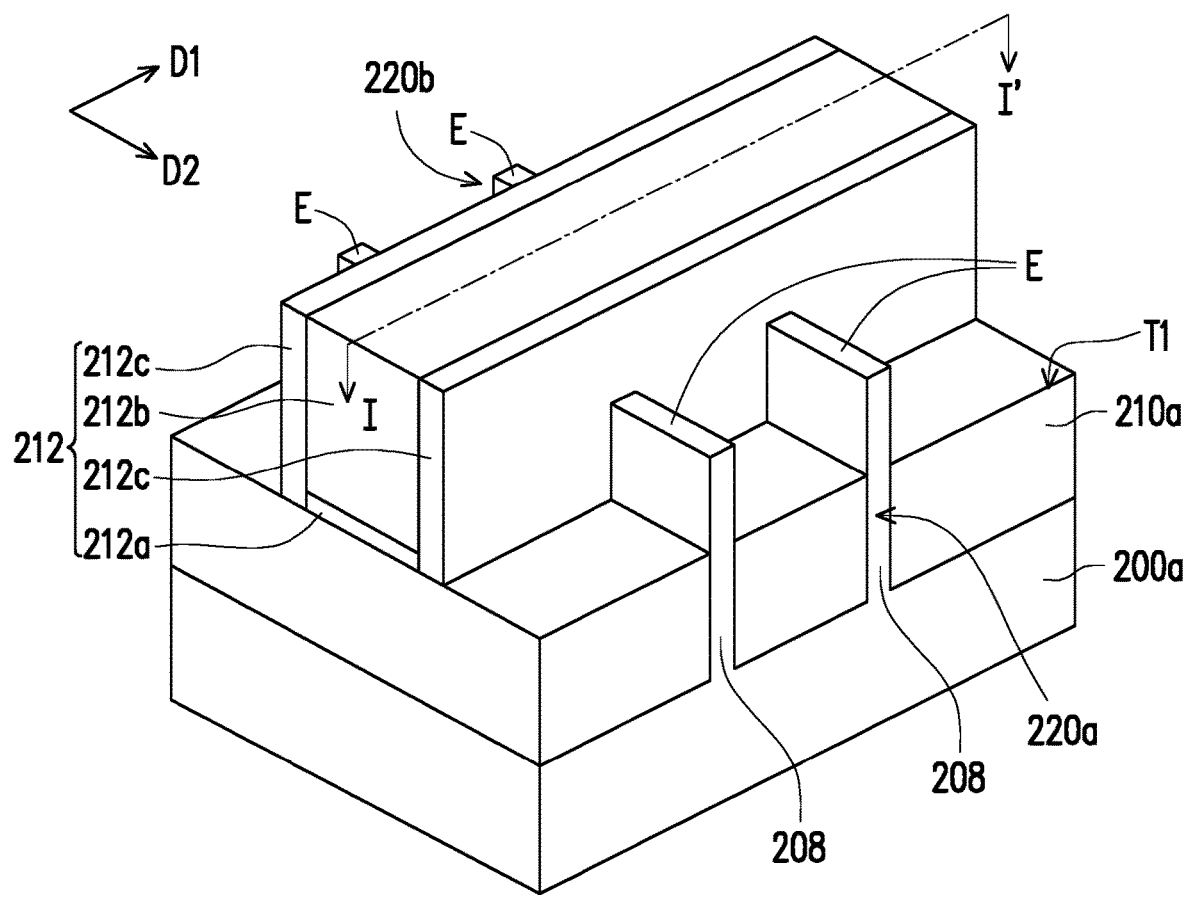
Figure 5G:
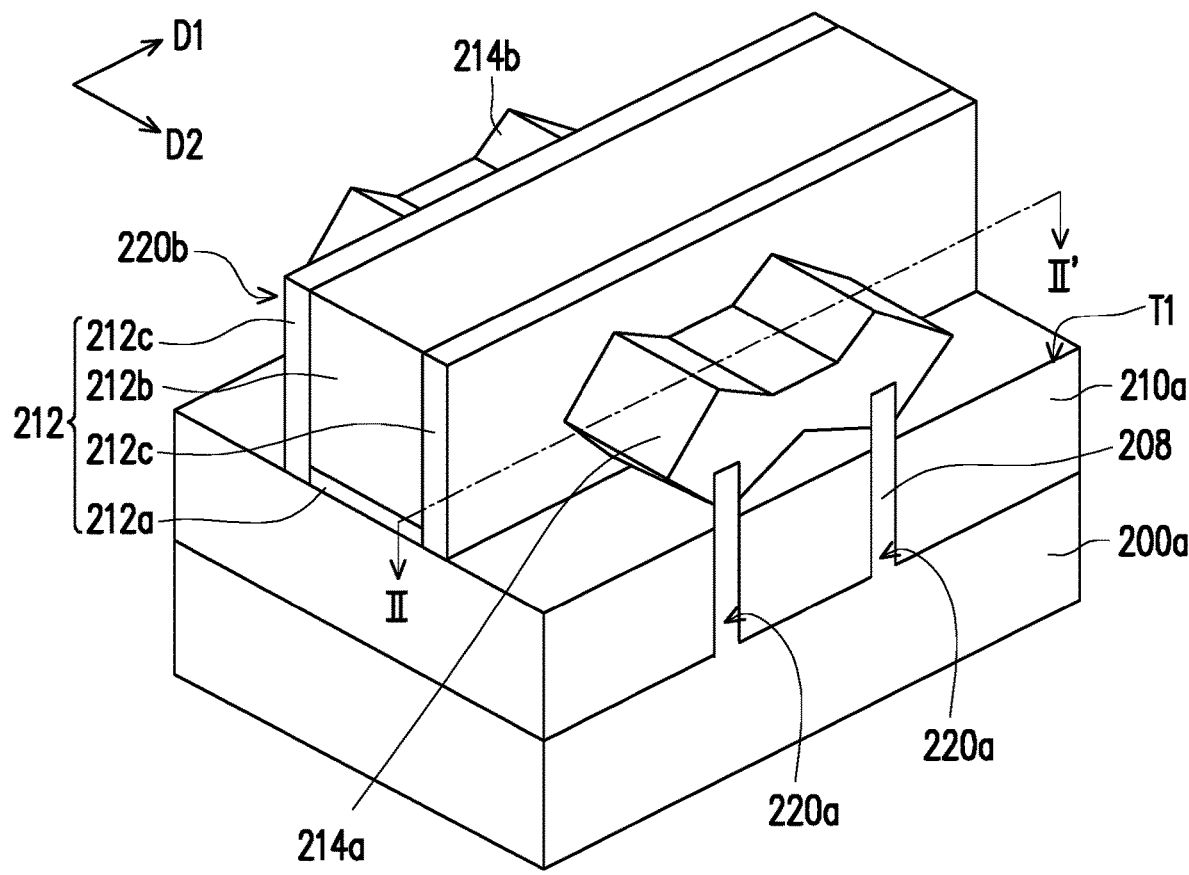
Figure 5H:
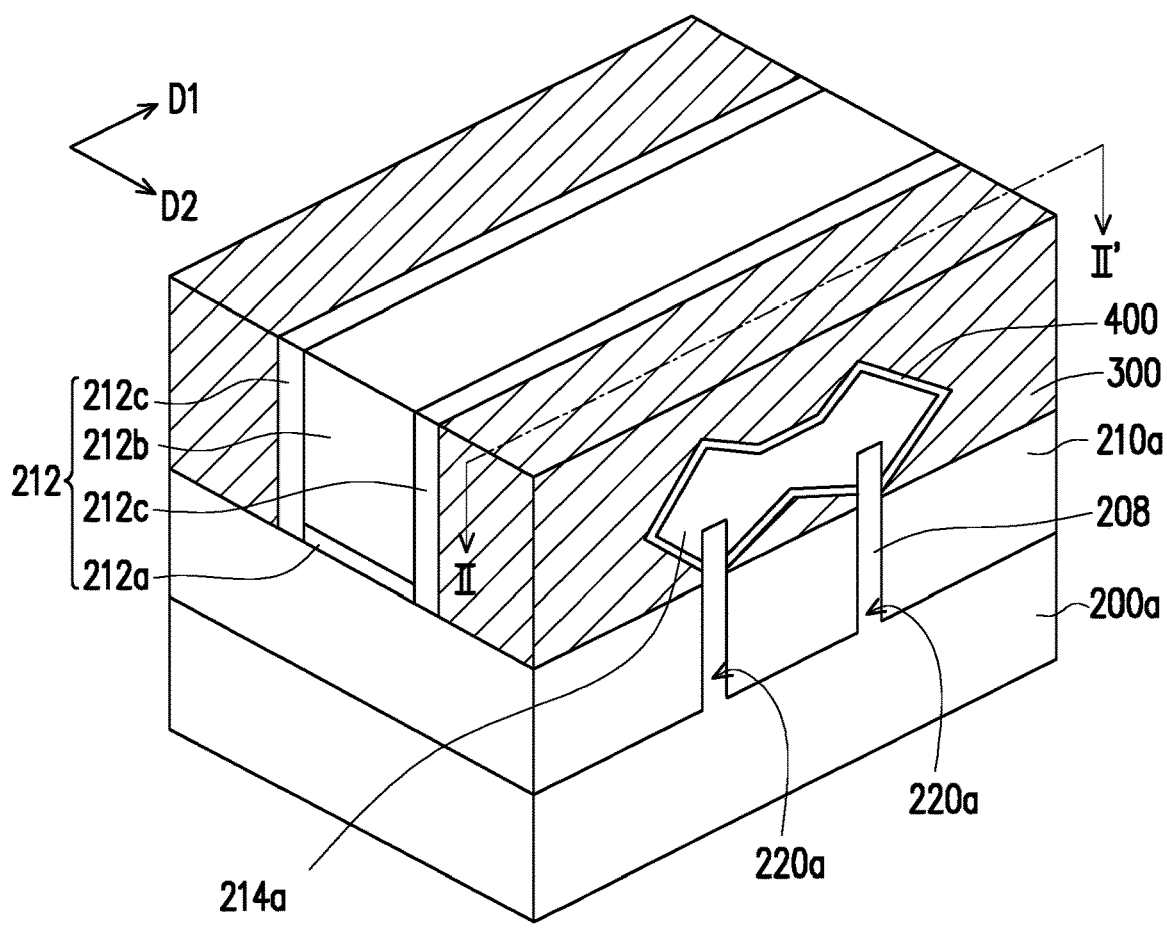
Figure 5I:
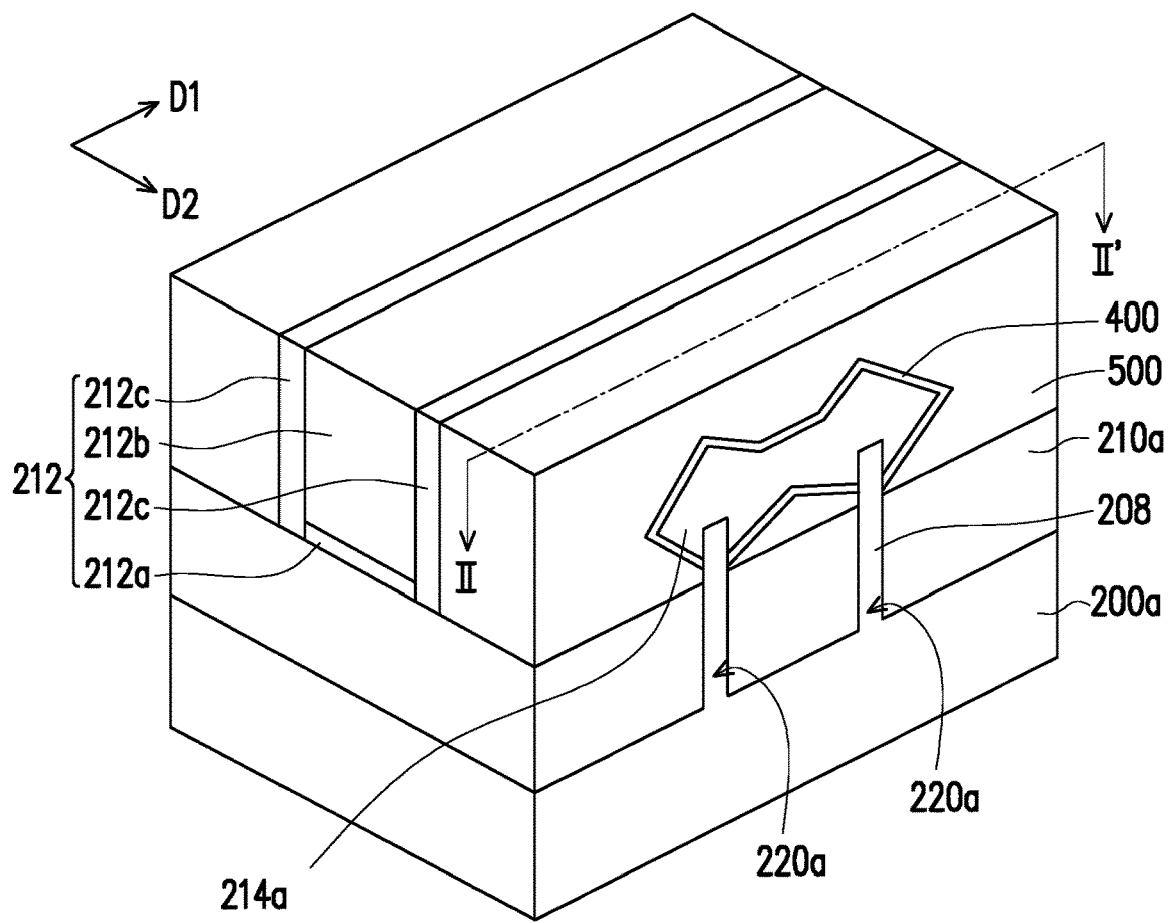
Figure 5J:
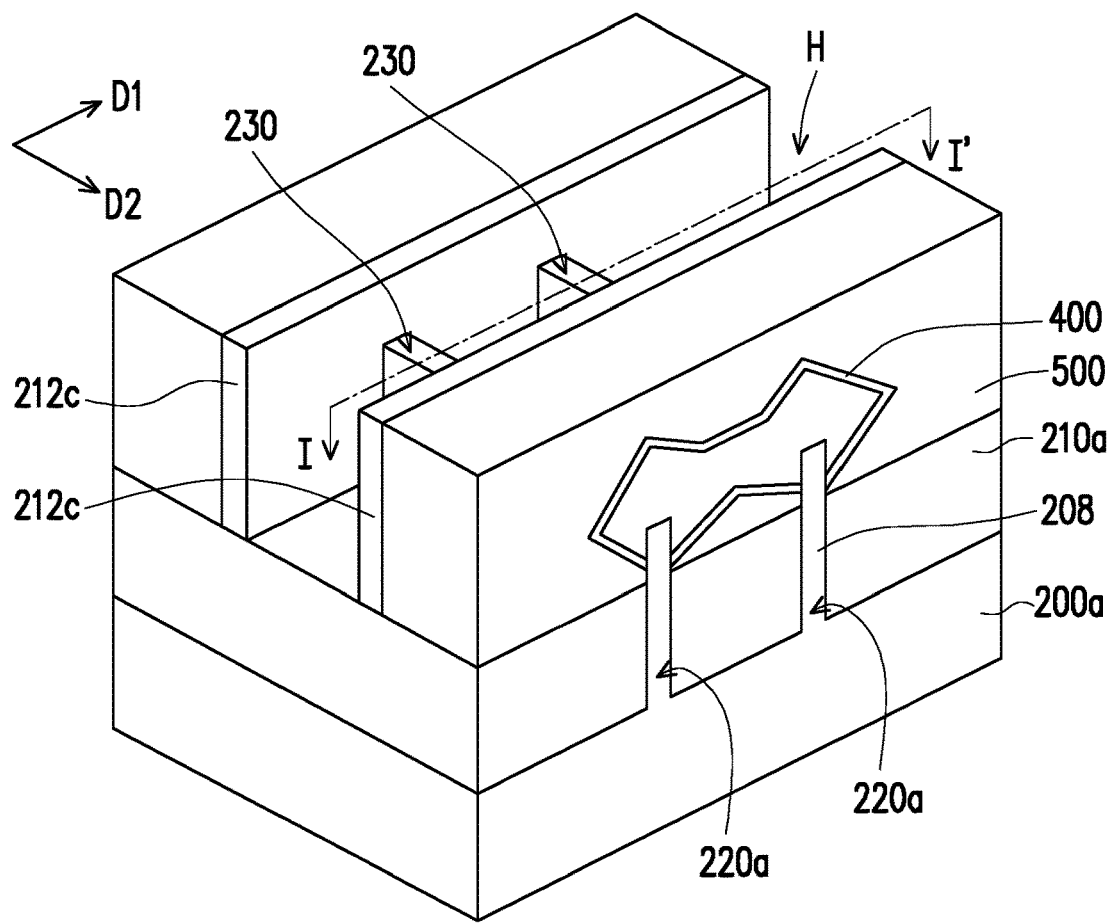
Figure 5K:
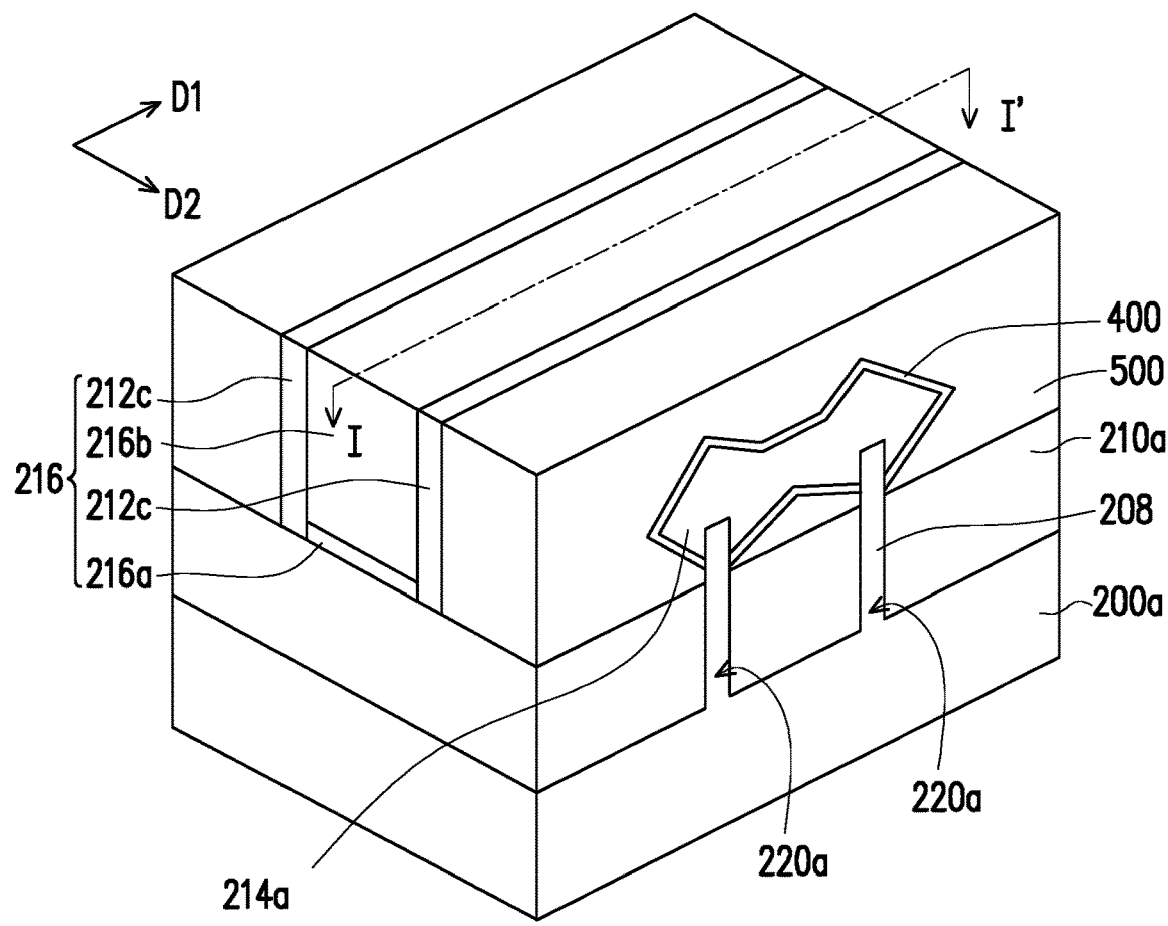
Figure 5L:
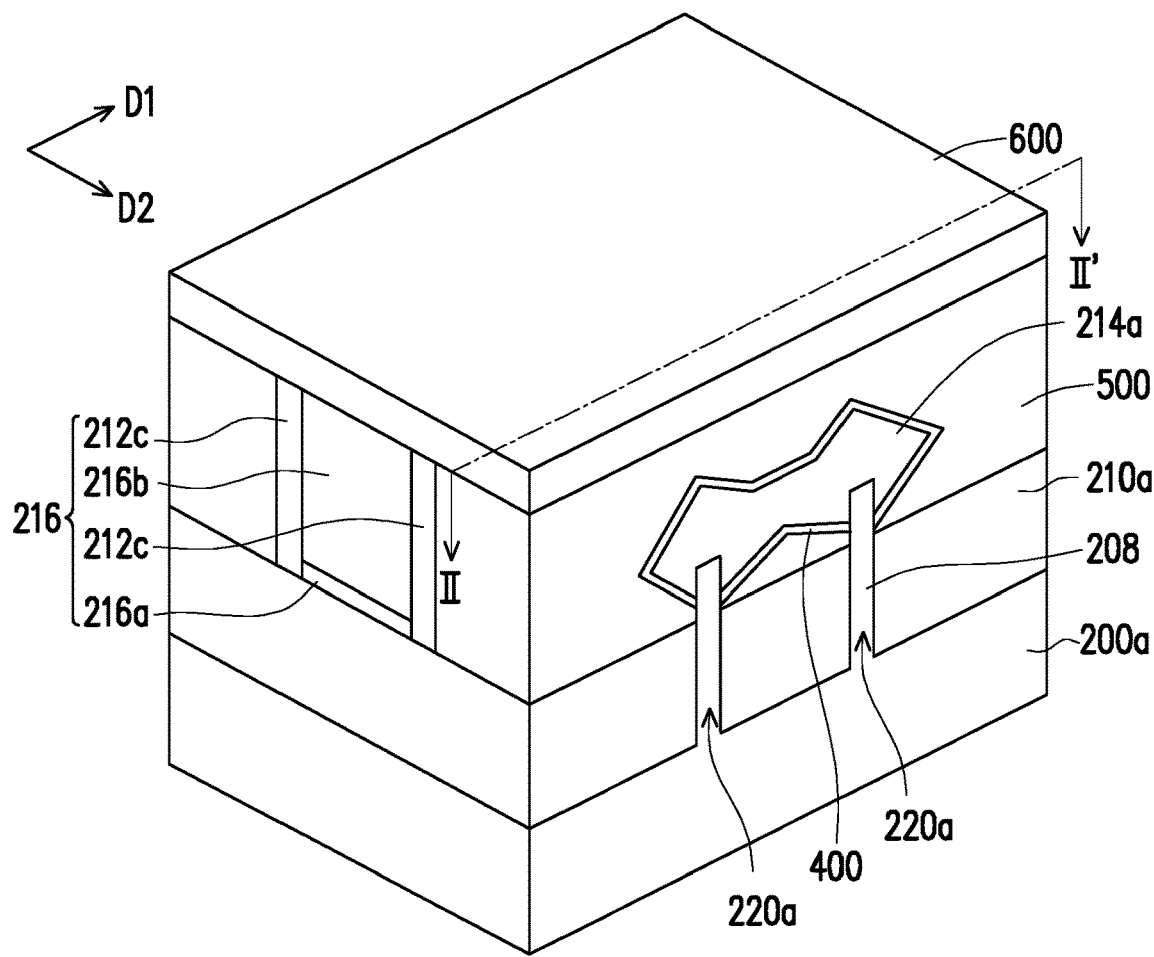
Figure 5M:
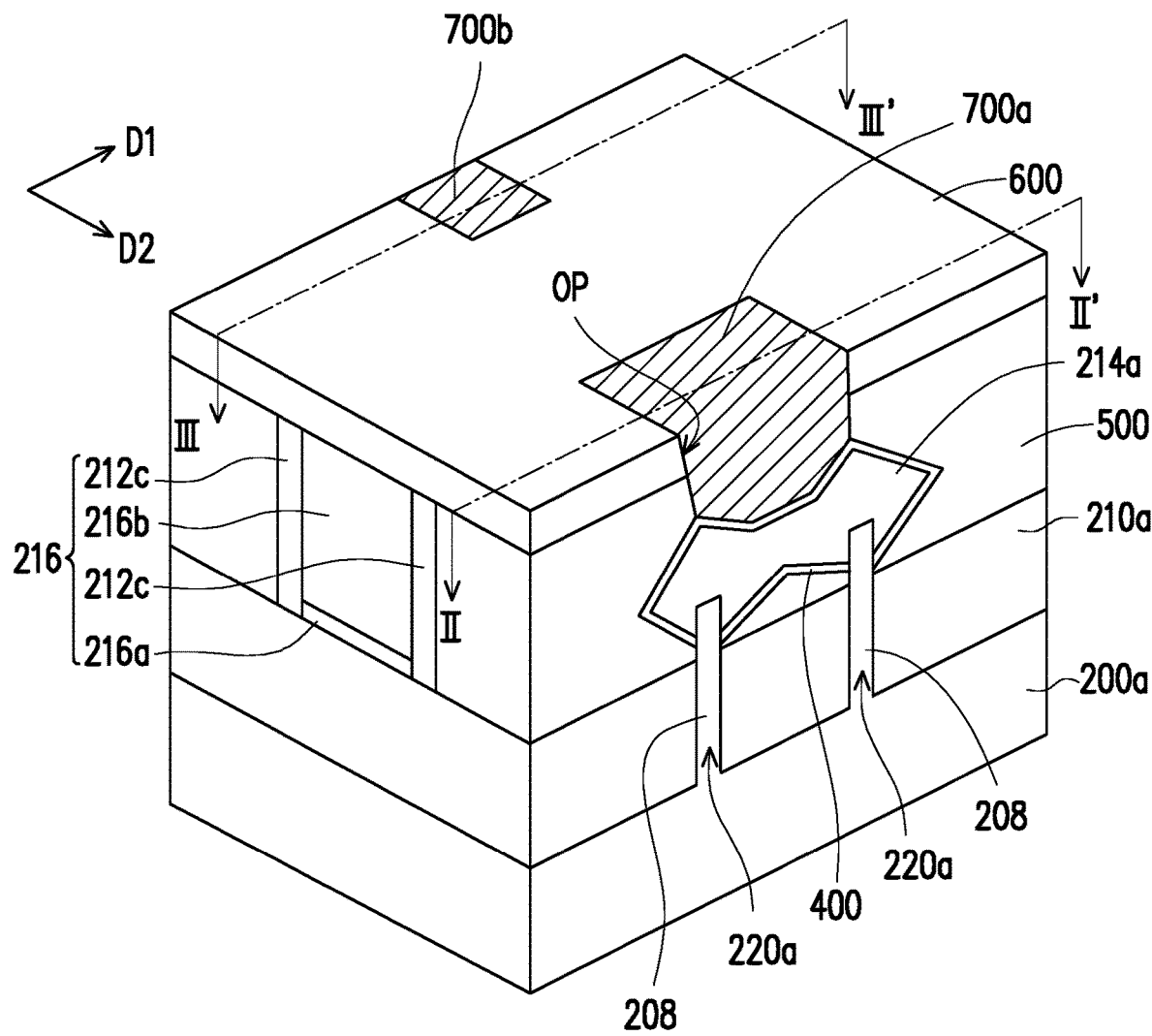
Figure 5N:
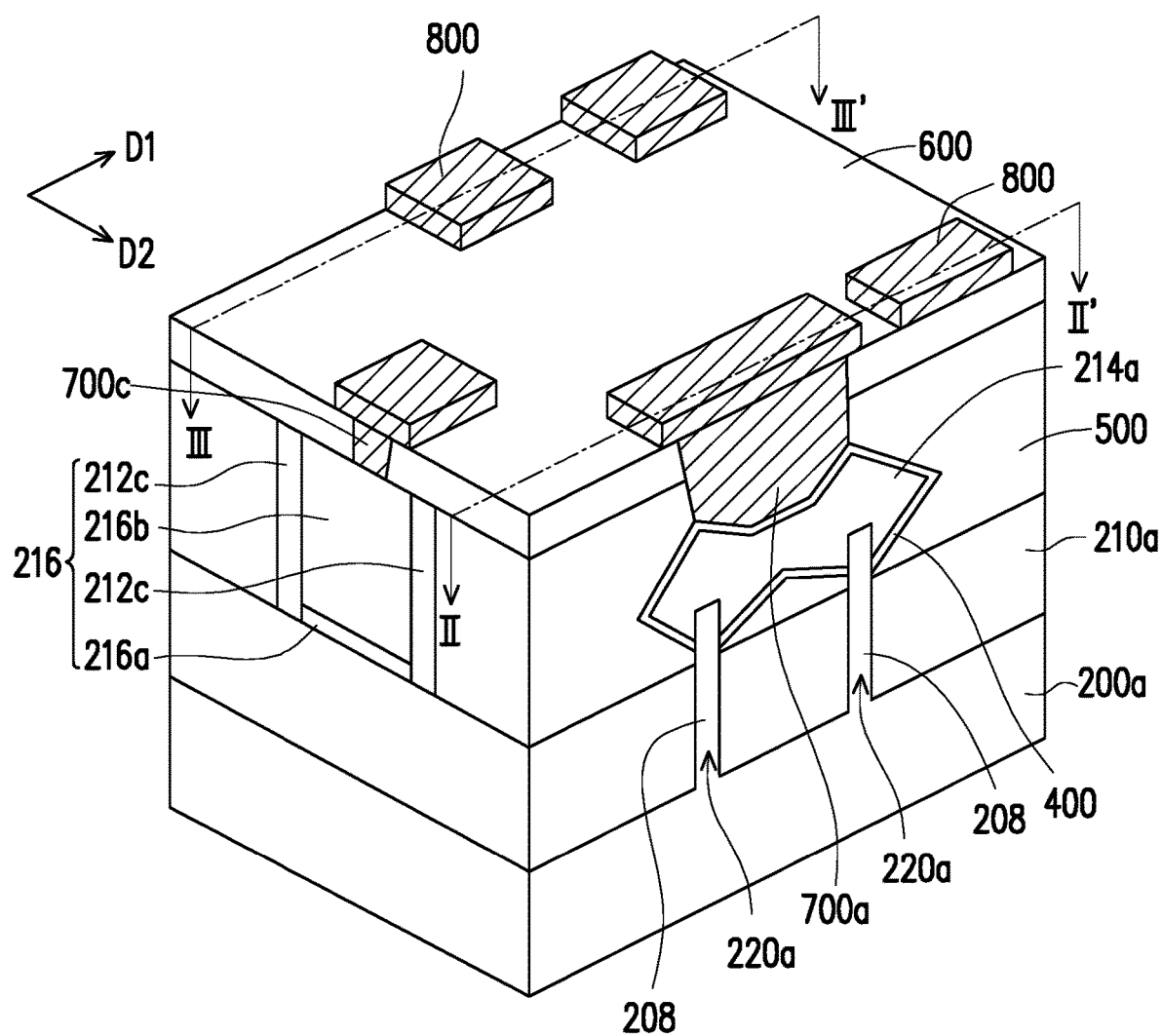

FIG. 5A to FIG. 5N are perspective views illustrating a manufacturing method of a FET 10 in accordance with some embodiments of the disclosure. FIG. 6A to FIG. 6N are cross-sectional views of FIG. 5A to FIG. 5N. In FIG. 5A to FIG. 5N and FIG. 6A to FIG. 6N, FinFET is being adapted as an exemplary illustration for the FET 10. However, it should be understood that the disclosure is not limited thereto. In some alternative embodiments, the FET 10 may include planar MOSFET (Metal-Oxide-Semiconductor Field-Effect Transistor), Gate-all-around (GAA) FET, or other suitable transistors. In other words, the algorithm shown in FIG. 1 and FIG. 3 may be adapted to fabricate FinFET, planar MOSFET, GAA FET, or other suitable transistors.

Referring to FIG. 5A and FIG. 6A, a semiconductor substrate 200 is provided. In some embodiments, the semiconductor substrate 200 includes a crystalline silicon substrate (e.g., wafer). The semiconductor substrate 200 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the semiconductor substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 202a and a mask layer 202b are sequentially formed on the semiconductor substrate 200. The pad layer 202a may be a silicon oxide thin film formed by, for example, a thermal oxidation process. The pad layer 202a may act as an adhesion layer between the semiconductor substrate 200 and the mask layer 202b. The pad layer 202a may also act as an etch stop layer for etching the mask layer 202b. In some embodiments, the mask layer 202b is a silicon nitride layer formed by, for example, low-pressure chemical vapor deposition (LPCVD) or plasma enhanced chemical vapor deposition (PECVD). The mask layer 202b is used as a hard mask during subsequent photolithography processes. A patterned photoresist layer 204 having a predetermined pattern is formed on the mask layer 202b.

Figure 6B:
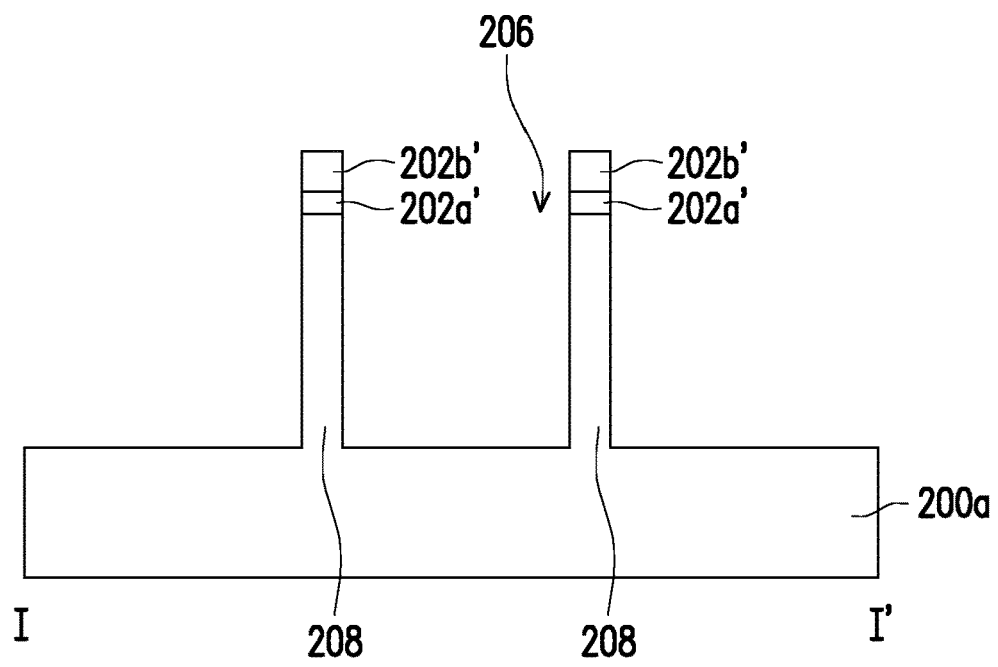

Referring to FIG. 5B and FIG. 6B, the mask layer 202b and the pad layer 202a which are not covered by the patterned photoresist layer 204 are sequentially etched to form a patterned mask layer 202b' and a patterned pad layer 202a', and the underlying semiconductor substrate 200 is exposed. By using the patterned mask layer 202b', the patterned pad layer 202a', and the patterned photoresist layer 204 as a mask, portions of the semiconductor substrate 200 are exposed and etched to form trenches 206 and semiconductor fins 208. The semiconductor fins 208 are covered by the patterned mask layer 202b', the patterned pad layer 202a', and the patterned photoresist layer 204. Two adjacent trenches 206 are spaced apart by a spacing. In other words, two adjacent trenches 206 are spaced apart by a corresponding semiconductor fin 208, and each of the semiconductor fin 208 is located between two adjacent trenches 206. After the trenches 206 and the semiconductor fins 208 are formed, the patterned photoresist layer 204 is then removed. In some embodiments, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 6C:
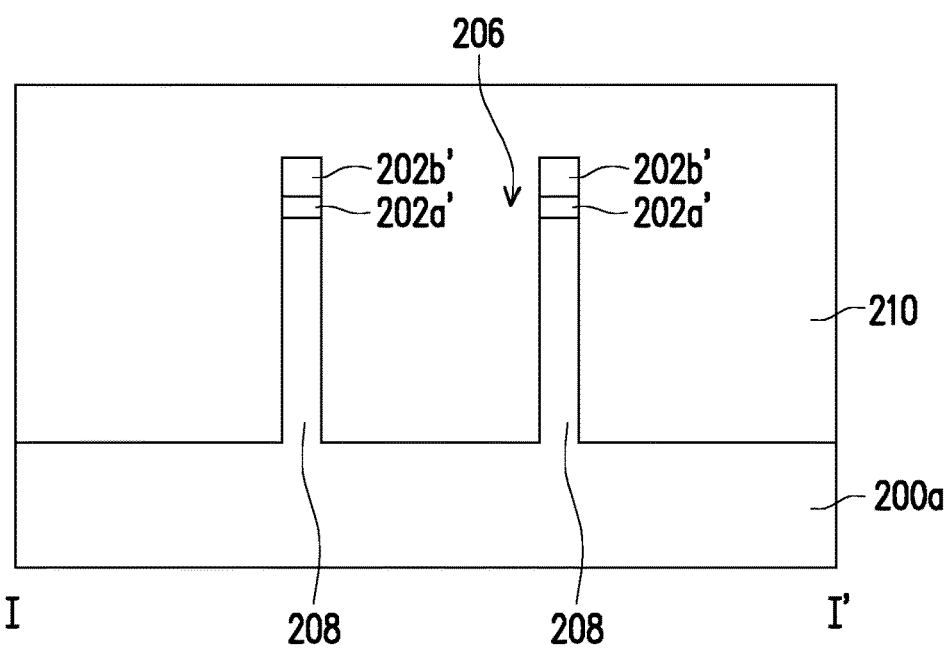

Referring to FIG. 5C and FIG. 6C, an insulating material 210 is formed over the semiconductor substrate 200a to cover the semiconductor fins 208 and to fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. It should be noted that the low-K dielectric materials are generally dielectric materials having a dielectric constant lower than 3.9. The insulating material 210 may be formed by high-density-plasma chemical vapor deposition (HDP-CVD), sub-atmospheric CVD (SACVD), or by spin-on coating.

Figure 6D:
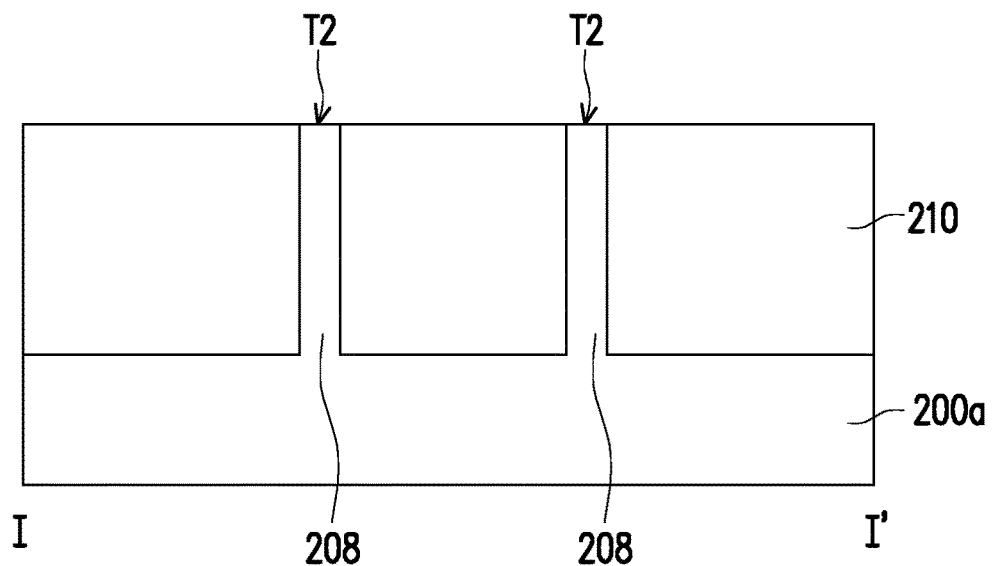

Referring to FIG. 5D and FIG. 6D, a chemical mechanical polish (CMP) process is, for example, performed to remove the patterned mask layer 202b', the patterned pad layer 202a', and a portion of the insulating material 210 until the semiconductor fins 208 are exposed. As shown in FIG. 5D and FIG. 6D, after the insulating material 210 is polished, top surfaces of the polished insulating material 210 is substantially coplanar with top surface T2 of the semiconductor fins 208.

Figure 6E:
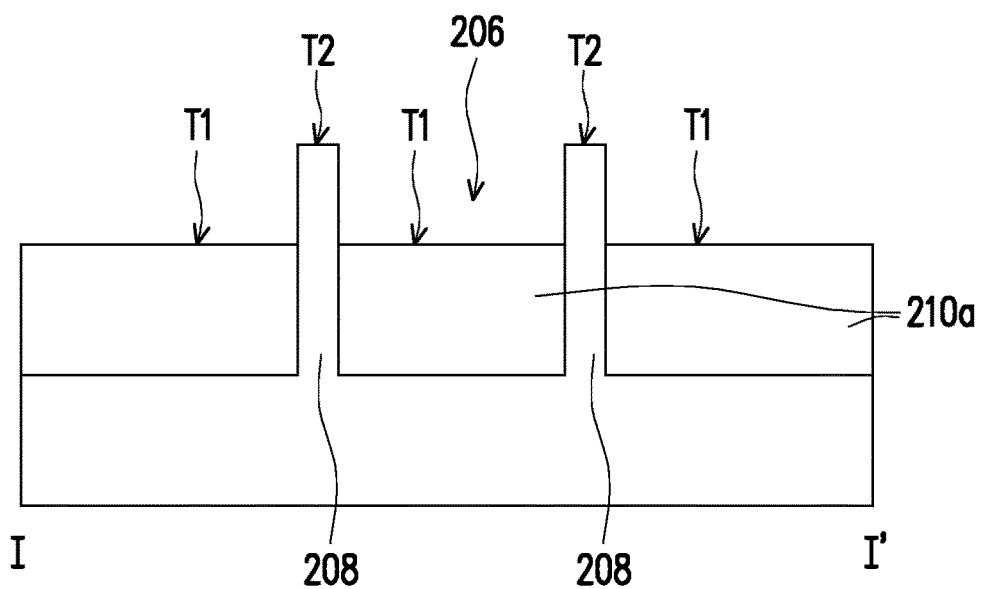

Referring to FIG. 5E and FIG. 6E, the polished insulating material 210 filled in the trenches 206 is partially removed by an etching process such that insulators 210a are formed on the semiconductor substrate 200a. In some embodiments, each insulator 210a is located between two adjacent semiconductor fins 208. In other words, the insulators 210a are located in the trenches 206. In some embodiments, the etching process may be a wet etching process with hydrofluoric acid (HF) or a dry etching process. The top surfaces T1 of the insulators 210a are lower than the top surfaces T2 of the semiconductor fins 208. In other words, the semiconductor fins 208 protrude from the top surfaces T1 of the insulators 210a.

Figure 6F:
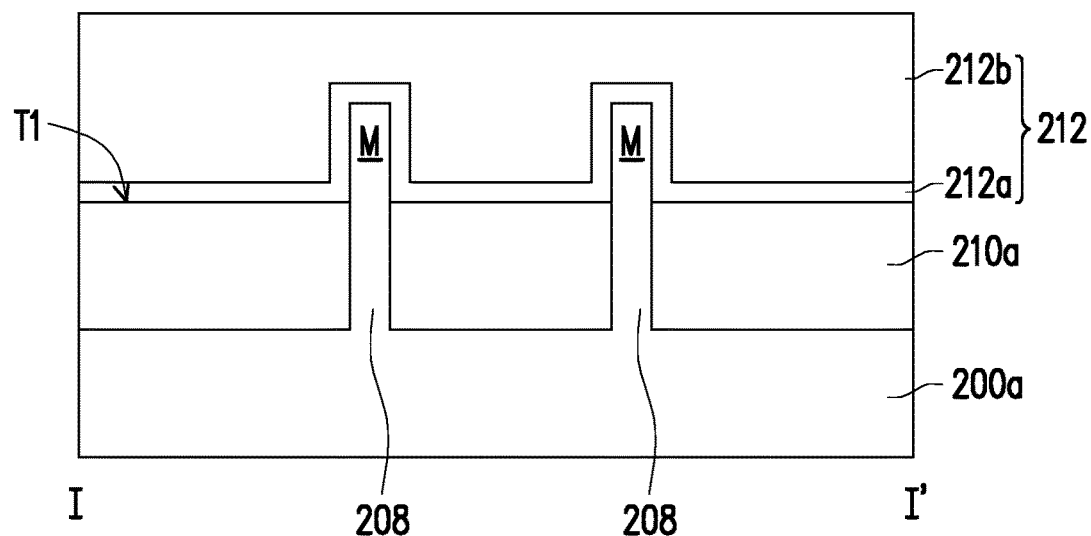

Referring to FIG. 5F and FIG. 6F, a dummy gate stack 212 is formed over portions of the semiconductor fins 208 and portion of the insulators 210a. In some embodiments, the extending direction D1 of the dummy gate stack 212 is, for example, perpendicular to the extension direction D2 of the semiconductor fins 208 so as to cover the middle portions M of the semiconductor fins 208. The dummy gate stack 212 includes a dummy gate dielectric layer 212a and a dummy gate 212b disposed over the dummy gate dielectric layer 212a. The dummy gate 212b is disposed over portions of the semiconductor fins 208 and over portions of the insulators 210a.

The dummy gate dielectric layer 212a is formed to cover the middle portions M of the semiconductor fins 208. In some embodiments, the dummy gate dielectric layer 212a may include silicon oxide, silicon nitride, silicon oxynitride, or high-K dielectrics. High-K dielectrics includes metal oxides. It should be noted that the high-K dielectric materials are generally dielectric materials having a dielectric constant greater than 4. Examples of metal oxides used for high-K dielectrics include oxides of Li, Be, Mg, Ca, Sr, Sc, Y, Zr, Hf, Al, La, Ce, Pr, Nd, Sm, Eu, Gd, Tb, Dy, Ho, Er, T, Yb, Lu, and/or mixtures thereof. The dummy gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. The dummy gate 212b is then formed on the dummy gate dielectric layer 212a. In some embodiments, the dummy gate 212b may include a single layer or multilayered structure. In some embodiments, the dummy gate 212b includes a silicon-containing material, such as polysilicon, amorphous silicon or a combination thereof. The dummy gate 212b may be formed using a suitable process such as ALD, CVD, PVD, plating, or combinations thereof.

In addition, the dummy gate stack 212 may further include a pair of spacers 212c disposed on sidewalls of the dummy gate dielectric layer 212a and the dummy gate 212b. The pair of spacer 212c may further cover portions of the semiconductor fins 208. The spacers 212c are formed of dielectric materials, such as silicon nitride or SiCON. The spacers 212c may include a single layer or multilayer structure. Portions of the semiconductor fins 208 that are not covered by the gate stack 212 are referred to as exposed portions E hereinafter. In some embodiments, the exposed portions E of the semiconductor fins 208 located on one side of the dummy gate stack 212 constitute source regions 220a of the semiconductor fins 208 while the exposed portions E of the semiconductor fins 208 located on another side of the dummy gate stack 212 constitute drain regions 220b of the semiconductor fins 208.

Figure 6G:
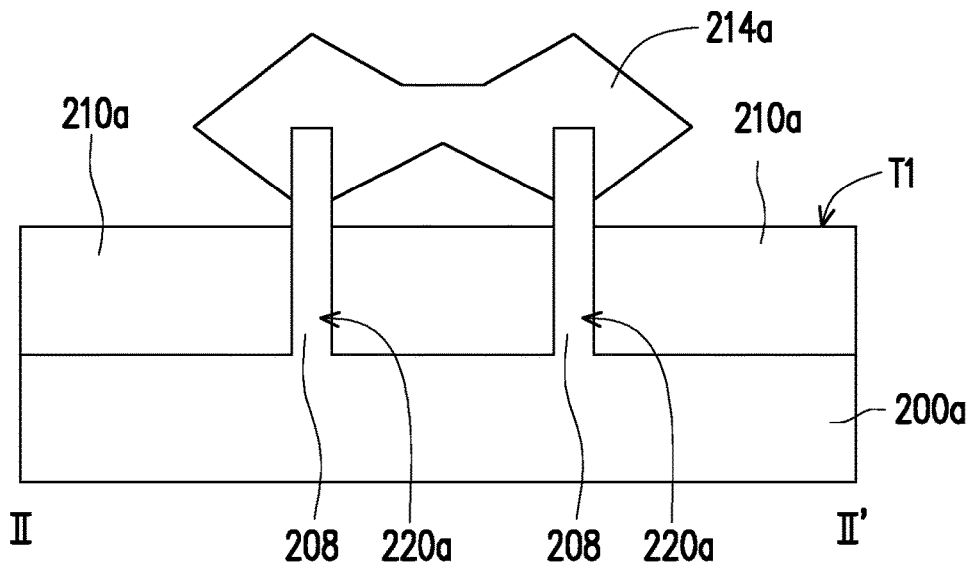

Referring to FIG. 5G and FIG. 6G, a first strained material 214a and a second strained material 214b are grown over the exposed portions E of the semiconductor fins 208 to strain or stress the semiconductor fins 208. In some embodiments, the first strained material 214a and the second strained material 214b are grown on two opposite sides of the dummy gate stack 212. For example, the first strained material 214a is located on one side of the dummy gate stack 212 and the second strained material 214b is located on another side of the dummy gate stack 212. In other words, the first strained material 214a is formed over the source regions 220a of the semiconductor fin 208 and the second strained material 214b is formed over the drain regions 220b of the semiconductor fin 208. Thus, the first strained material 214a may be considered as a source of the device while the second strained material 214b may be considered as a drain of the device.

The first strained material 214a and the second strained material 214b may be doped with a conductive dopant. In some embodiments, the first strained material 214a and the second strained material 214b, such as SiGe, are epitaxial-grown with a p-type dopant for straining a p-type FinFET. That is, the first strained material 214a and the second strained material 214b are doped with the p-type dopant to be the source and the drain of the p-type FinFET. The p-type dopant includes boron or $BF_2$, and the first strained material 214a and the second strained material 214b may be epitaxial-grown by LPCVD process with in-situ doping. However, the disclosure is not limited thereto. In some alternative embodiments, the first strained material 214a and the second strained material 214b, such as SiC, are epitaxial-grown with an n-type dopant for straining an n-type FinFET. That is, the first strained material 214a and the second strained material 214b are doped with the n-type dopant to be the source and the drain of the n-type FinFET. The n-type dopant includes arsenic and/or phosphorus, and the first strained material 214a and the second strained material 214b may be epitaxial-grown by LPCVD process with in-situ doping. In some embodiments, the first strained material 214a and the second strained material 214b are grown to have substantially identical size. For example, the first strained material 214a and the second strained material 214b may be symmetrical. However, the disclosure is not limited thereto. In some alternative embodiments, the first strained material 214a and the second strained material 214b may be grown to have different sizes.

It should be noted that the method shown in FIGS. 5G and 6G is merely an exemplary illustration for forming the first strained material 214a and the second strained material 214b, and the disclosure is not limited thereto. In some alternative embodiments, the exposed portions E of the semiconductor fins 208 may be recessed below the top surfaces T1 of the insulators 210a, and the first and second strained materials 214a, 214b may be grown from the recessed portion and extend beyond the top surfaces T1 of the insulators 210a to strain or stress the semiconductor fins 208.

Figure 6H:
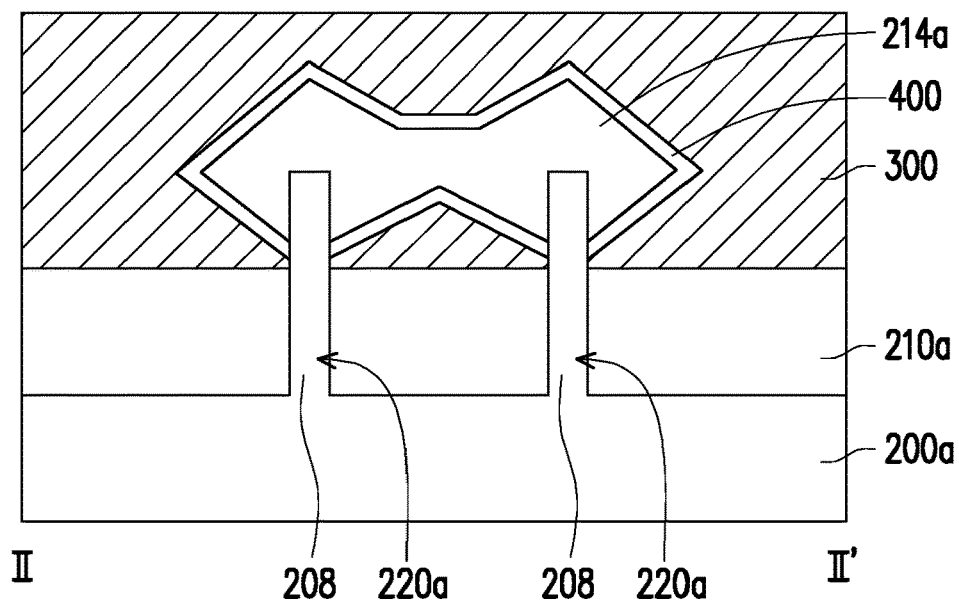

Referring to FIG. 5H and FIG. 6H, a conductive layer 300 is formed over the insulators 210a to cover the first strained material 214a and the second strained material 214b. In some embodiments, the conductive layer 300 includes titanium, nickel, cobalt, or the like. In some embodiments, the conductive layer 300 may be deposited through a suitable process such as atomic layer deposition (ALD), chemical vapor deposition (CVD), or physical vapor deposition (PVD). Thereafter, an annealing process may be performed using, for example, thermal soaking, pike annealing, flash annealing, laser annealing, or the like to form a silicide layer 400 between the conductive layer 300 and the first strained material 214a and between the conductive layer 300 and the second strained material 214b. In some embodiments, the silicide layer 400 includes metal silicide. As illustrated in FIG. 5H and FIG. 6H, the conductive layer 300 wraps around the first and second strained materials 214a, 214b, so the silicide layer 400 formed also wraps around the first and second strained materials 214a, 214b. However, the disclosure is not limited thereto. FIG. 7 is a cross-sectional view of FIG. 5H in accordance with some alternative embodiments of the disclosure. Referring to FIG. 7, in some alternative embodiments, the conductive layer 300 partially covers the first strained material 214a and partially covers the second strain material 214b. Therefore, the silicide layer 400 formed between the conductive layer 300 and the first and second strained materials 214a, 214b also partially covers the first strained material 214a and partially covers the second strained material 214b. Although the step shown in FIG. 7 may be performed at this stage, the disclosure is not limited thereto. In some embodiments, the step of forming the silicide layer 400 shown in FIG. 7 may be performed in later steps. For example, the step of forming the silicide layer 400 shown in FIG. 7 may be performed after the step shown in FIG. 5K and FIG. 6K or after the step shown in FIG. 5L and FIG. 6L.

Figure 6I:
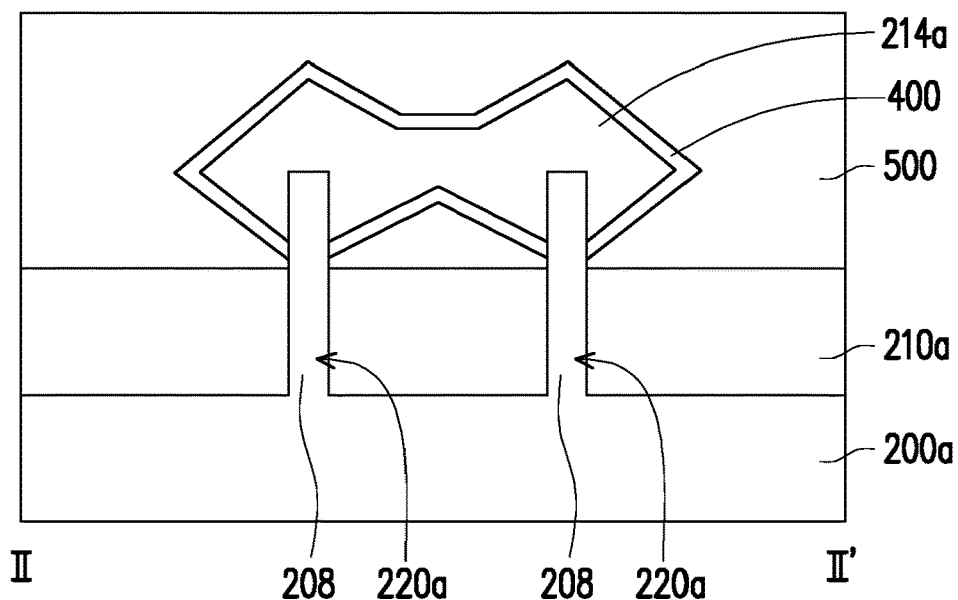

Referring to FIG. 5I and FIG. 6I, the conductive layer 300 is removed and an interlayer dielectric layer 500 is formed over the insulators 210a to cover the first strained material 214a and the second strained material 214b. In other words, the interlayer dielectric layer 500 is formed adjacent to the spacers 212c. The interlayer dielectric layer 500 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer 500 includes low-K dielectric materials. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 500 may include one or more dielectric materials and/or one or more dielectric layers. In some embodiments, the interlayer dielectric layer 500 is formed to a suitable thickness by Flowable CVD (FCVD), CVD, HDPCVD, SACVD, spin-on, sputtering, or other suitable methods. Specifically, an interlayer dielectric material layer (not illustrated) is formed to cover the insulators 210a and the dummy gate stack 212 first. Subsequently, the thickness of the interlayer dielectric material layer is reduced until a top surface of the dummy gate stack 212 is exposed, so as to form the interlayer dielectric layer 500. The thickness of the interlayer dielectric material layer may be reduced by a chemical mechanical polishing (CMP) process, an etching process, or other suitable process.

Figure 6J:
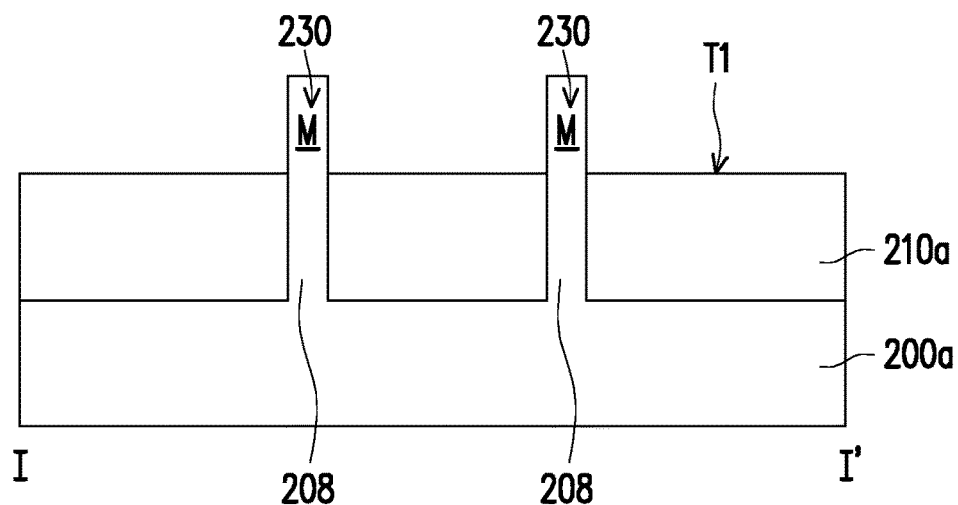

Referring to FIG. 5J and FIG. 6J, portions of the dummy gate stack 212 is removed to form a hollow portion H exposing a portion of the semiconductor fin 208. For example, the dummy gate dielectric layer 212a and the dummy gate 212b are removed, and the hollow portion H exposes part of the middle portions M of the semiconductor fin 208. It should be noted that the semiconductor fin 208 exposed by the hollow portion H may act as a channel region 230.

In some embodiments, the dummy gate dielectric layer 212a and the dummy gate 212b are removed through an etching process or other suitable processes. For example, the dummy gate dielectric layer 212a and the dummy gate 212b may be removed through wet etching or dry etching. Example of wet etching includes chemical etching and example of dry etching includes plasma etching, but the disclosure is not limited thereto. Other commonly known etching method may also be adapted to perform the removal of the dummy gate dielectric layer 212a and the dummy gate 212b.

Figure 6K:
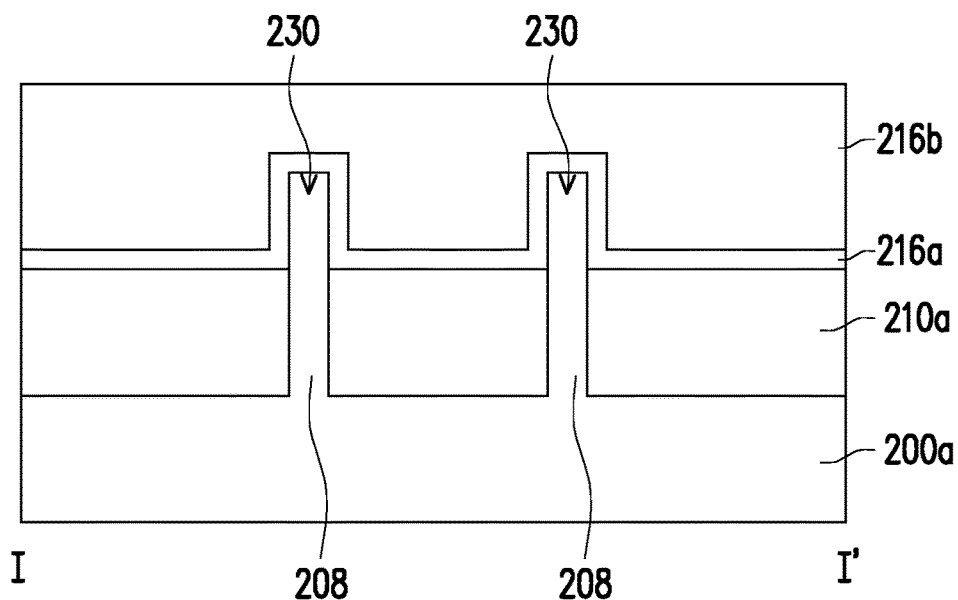
Figure 7:
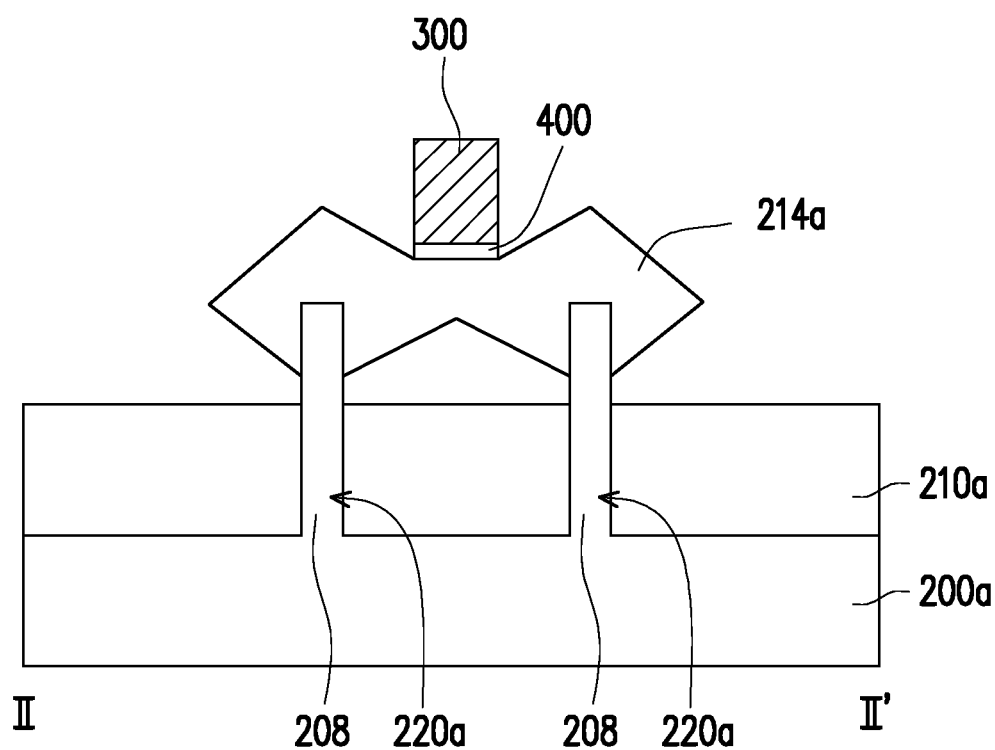
FIG. 7 is a cross-sectional view of FIG. 5H in accordance with some alternative embodiments of the disclosure.

Referring to FIG. 5K and FIG. 6K, a gate dielectric material and a gate material are filled into the hollow portion H to form a gate stack 216. In other words, the gate stack 216 is disposed over the semiconductor fins 208 and on the insulators 210a. The first strained material 214a is located on one side of the gate stack 216 while the second strained material 214b is located on another side of the gate stack 216. In some embodiments, the gate stack 216 includes a gate dielectric layer 216a, a gate 216b, and the spacers 212c. The gate dielectric layer 216a is disposed over the channel region 230 of the semiconductor fin 208, the gate 216b is disposed over the gate dielectric layer 216a, and the spacers 213c are disposed on sidewalls of the gate dielectric layer 216a and the gate 216b. A material of the gate dielectric layer 216a may be identical to or different from the material of the dummy gate dielectric layer 212a. For example, the gate dielectric layer 216a includes silicon oxide, silicon nitride, silicon oxy-nitride, high-K dielectric materials, or a combination thereof. High-K dielectric materials include metal oxides such as oxides of Li, Be, Mg, Ca, Sr, Sc, Y, Zr, Hf, Al, La, Ce, Pr, Nd, Sm, Eu, Gd, Tb, Dy, Ho, Er, Tin, Yb, Lu, and/or a combination thereof. The gate dielectric layer 216a is formed using a suitable process such as atomic layer deposition (ALD), chemical vapor deposition (CVD), physical vapor deposition (PVD), flowable chemical vapor deposition (FCVD), thermal oxidation, UV-ozone oxidation, or a combination thereof. The gate dielectric layer 216a may further include an interfacial layer (not shown). For example, the interfacial layer may be used in order to create a good interface between the semiconductor fin 208 and the gate 216b, as well as to suppress the mobility degradation of the channel carrier of the semiconductor device. Moreover, the interfacial layer may be formed by a thermal oxidation process, a chemical vapor deposition (CVD) process, or an atomic layer deposition (ALD) process. A material of the interfacial layer includes a dielectric material. For example, the interfacial layer may be a silicon oxide layer or a silicon oxynitride layer.

A material of the gate 216b includes metal, metal alloy, or metal nitride. For example, in some embodiments, the gate 216b may include TiN, WN, TaN, Ru, Ti, Ag, Al, TiAl, TiAlN, TaC, TaCN, TaSiN, Mn, or Zr. Moreover, the gate 216b may further include a barrier, a work function layer, or a combination thereof. In some embodiments, a liner layer, a seed layer, an adhesion layer, or a combination thereof may be included between the gate 216b and the semiconductor fins 208.

Figure 6L:
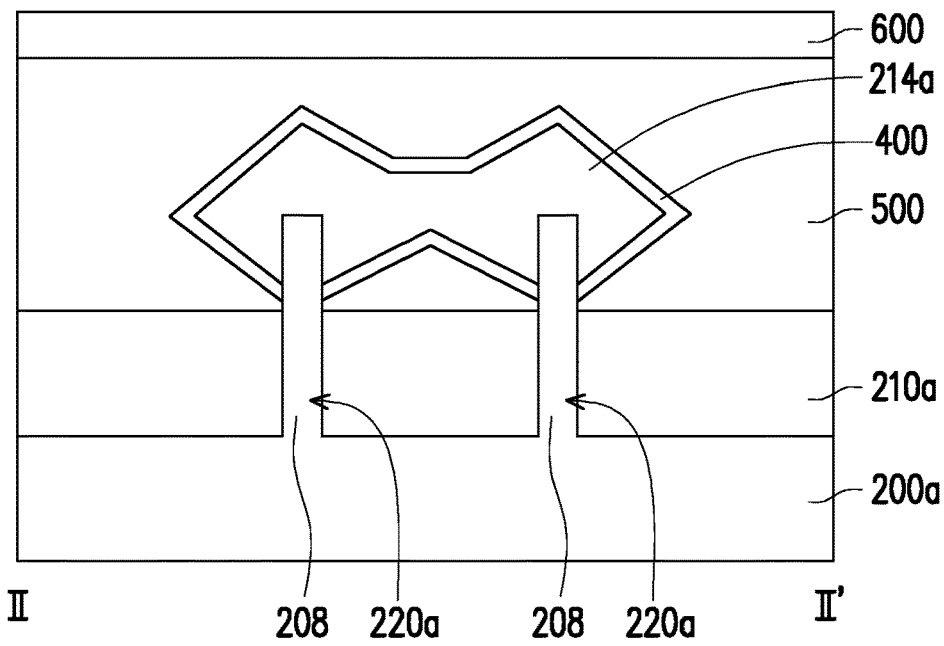

Referring to FIG. 5L and FIG. 6L, an etch stop layer 600 is formed over the gate stack 216 and the interlayer dielectric layer 500. In some embodiments, the etch stop layer 600 includes silicon nitride, carbon-doped silicon nitride, or a combination thereof. In some embodiments, the etch stop layer 600 may be referred to as a contact etch stop layer (CESL). The etch stop layer 600 may be deposited using, for example, CVD, high density plasma (HDP) CVD, sub-atmospheric CVD (SACVD), molecular layer deposition (MLD), or other suitable methods.

Figure 6M:
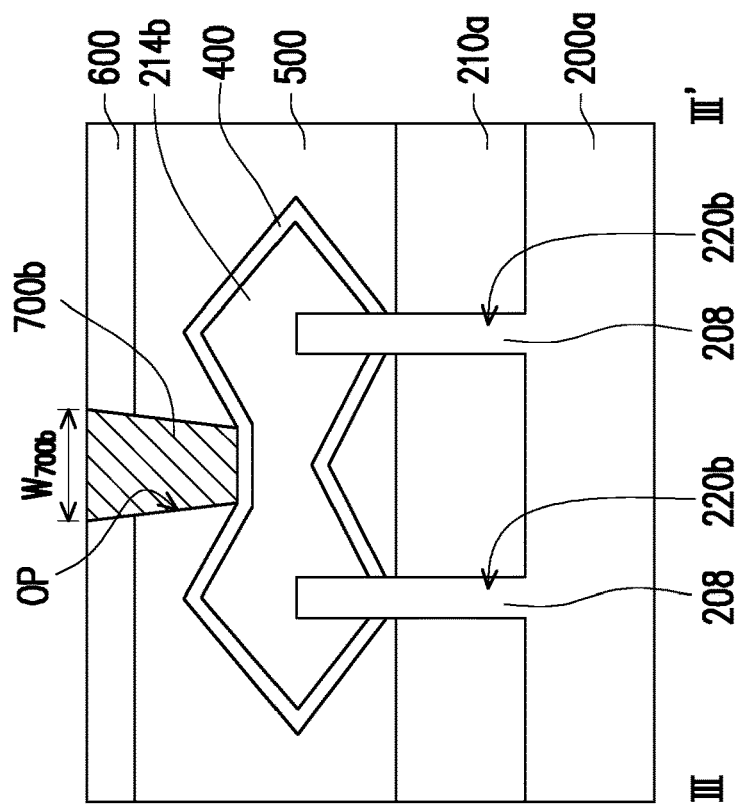
Figure 6M:
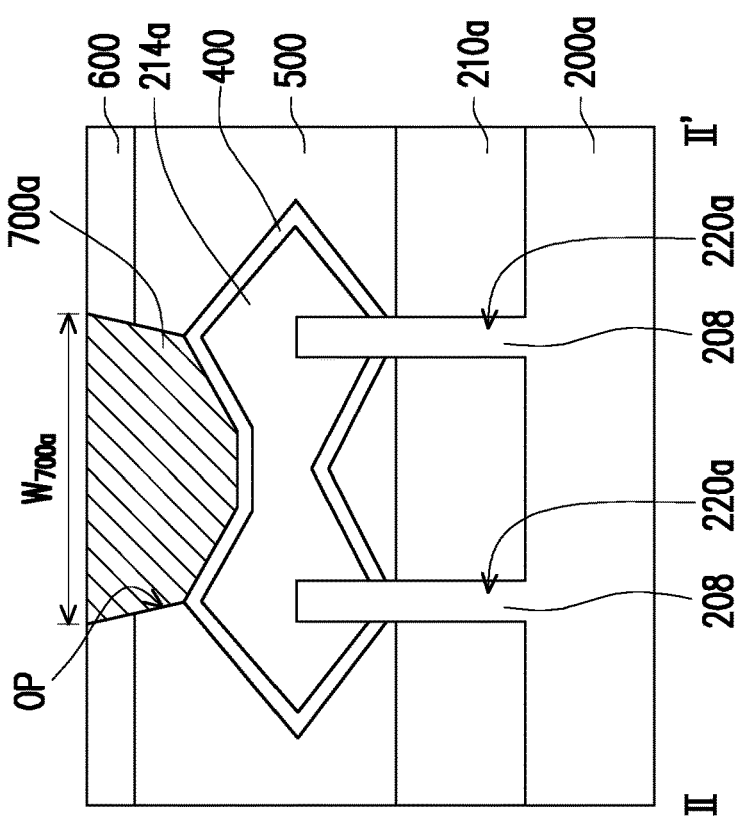
Figure 6N:
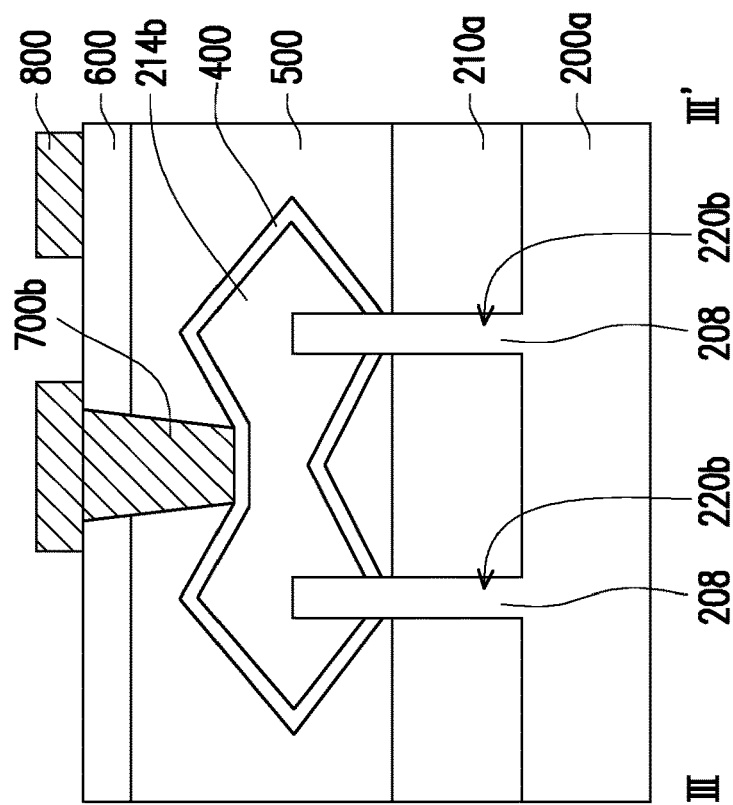
Figure 6N:
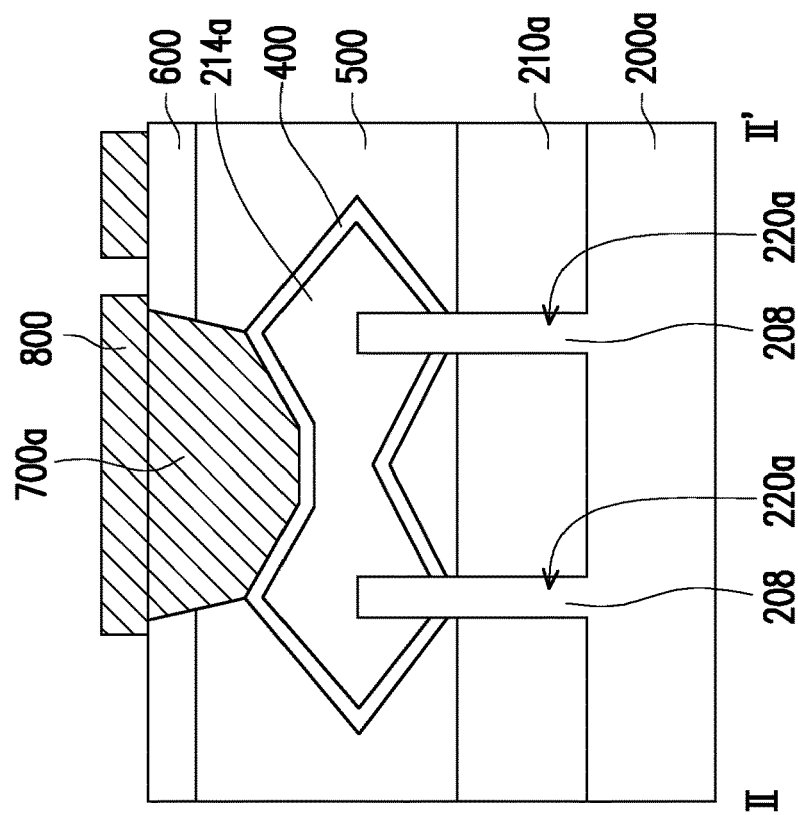

Referring to FIG. 5M and FIG. 6M, a plurality of openings OP is formed in the etch stop layer 600 and the interlayer dielectric layer 500. In some embodiments, the locations of the openings OP correspond to the location of the first strained material 214a and the location of the second strained material 214b. For example, the openings OP expose at least a portion of the silicide layer 400 located on the first strained material 214a and at least a portion of the silicide layer 400 located on the second strained material 214b. Thereafter, a first conductive via 700a and a second conductive via 700b are formed in the openings OP. In some embodiments, the first conductive via 700a and the second conductive via 700b penetrate through the etch stop layer 600 and the interlayer dielectric layer 500. In some embodiments, the first conductive via 700a is electrically connected to the first strained material 214a and the second conductive via 700b is electrically connected to the second strained material 214b. For example, the silicide layer 400 located on the first strained material 214a is directly in contact with the first conductive via 700a and the first strained material 214a. Similarly, the silicide layer 400 located on the second strained material 214b is directly in contact with the second conductive via 700b and the second strained material 214b. In some embodiments, the first conductive via 700a and the second conductive via 700b may include copper, copper alloys, nickel, aluminum, manganese, magnesium, silver, gold, tungsten, a combination of thereof, or the like. The first conductive via 700a and the second conductive via 700b may be formed by, for example, electro-chemical plating process, CVD, PECVD, ALD, PVD, a combination thereof, or the like.

Due to the compact integration of the device, the first strained material 214a and the second strained material 214b are considered as fine pitched features. That is, the pitch between two adjacent first strained materials 214a and the pitch between two adjacent second strained material 214b are relatively small. As such, an interconnection metal layer serving as an extension line for the source/drain regions may be omitted. In other words, the first conductive via 700a and the second conductive via 700b may be directly formed on the fine-pitched first strained material 214a and the second strained material 214b without any other metallic feature formed therebetween. It should be noted that the first conductive via 700a and the second conductive via 700b are different from interconnect metal layer (the extension line).

As mentioned above, the silicide layer 400 wraps around the first strained material 214a and the second strained material 214b. The larger surface area of the silicide layer 400 may yield larger contact window (landing area) for the first conductive via 700a and the second conductive via 700b. As such, the process complexity may be sufficiently reduced.

In some embodiments, a layout area of the first conductive via 700a is larger than a layout area of the second conductive via 700b. In other words, the first conductive via 700a and the second conductive via 700b may be asymmetrical. The layout area may refer to the area occupied by the first conductive via 700a and the second conductive via 700b in the schematic layout or the top view. For example, as illustrated in FIG. 6M, a width $W_{700a}$ of the first conductive via 700a is larger than a width $W_{700b}$ of the second conductive via 700b. As such, the first conductive via 700a connected to the source (the first strained material 214a) may be larger than the second conductive via 700b connected to the drain (the second strained material 214b) to provide larger surface area for electrical connection.

Referring to FIG. 5N and FIG. 6N, a gate contact 700c is formed in the etch stop layer 600. In some embodiments, the gate contact 700c is electrically connected to the gate 216b of the gate stack 216. In some embodiments, the gate contact 700c may include copper, copper alloys, nickel, aluminum, manganese, magnesium, silver, gold, tungsten, a combination of thereof or the like. The gate contact 700c may be formed by, for example, electro-chemical plating process, CVD, PECVD, ALD, PVD, a combination thereof, or the like. Thereafter, a plurality of routing patterns 800 is formed over the interlayer dielectric layer 500 and the etch stop layer 600 to obtain the FinFET (the FET 10). The routing patterns 800 are electrically connected to the first conductive via 700a and the second conductive via 700b. In some embodiments, the routing patterns 800 may include copper, copper alloys, nickel, aluminum, manganese, magnesium, silver, gold, tungsten, a combination of thereof or the like. The routing patterns 800 may be formed by, for example, electro-chemical plating process, CVD, PECVD, ALD, PVD, a combination thereof, or the like.

In some embodiments, the FET 10 is manufactured based on the verified schematic layout, as shown in step 106 of FIG. 1 and step 206 of FIG. 2. For example, the gate region $R_{216}$, the source region $R_{220a}$ of the semiconductor fin, the drain region $R_{220b}$ of the semiconductor fin, the first conductive via region $R_{700a}$, the second conductive via region $R_{700b}$, and the routing pattern region $R_{800}$ respectively corresponds to the location and the dimension of the gate stack 216, the source region 220a of the semiconductor fins 208, the drain region 220b of the semiconductor fins 208, the first conductive via 700a, the second conductive via 700b, and the routing patterns 800.

As mentioned above, the first conductive via 700a and the second conductive via 700b are different from interconnect metal layer. Therefore, as illustrated in FIG. 5N, the electrical connection between the source/drain regions (the first strained material 214a and the second strained material 214b) of the FET 10 with the routing patterns 800 may be achieved by solely the first and second conductive vias 700a, 700b. In other words, the FET 10 is free of interconnect metal layer (extension line) over the source/drain region. By omitting the interconnect metal layer, the manufacturing cost of the FET 10 may be effectively reduced. Moreover, the parasitic capacitance between the interconnect metal layer and the gate stack may be eliminated. In some embodiments, by omitting the interconnect metal layer, the layout design may cause errors in the verification process provided by the EDA verification software. However, by adapting the methods shown in FIG. 1 and FIG. 3 and by generating faker contact layers CL, CL2 (the dimensions of the faker contact layers CL, CL2 are similar to layout areas of the first strained material 214a and the second strained material 214b) into the layout scheme, the input and output signals may be obtained in the EDA verification software and the electrical connection between the source/drain (the first strained material 214a and the second strained material 214b) and the routing patterns 800 may be ensured.

Figure 8:
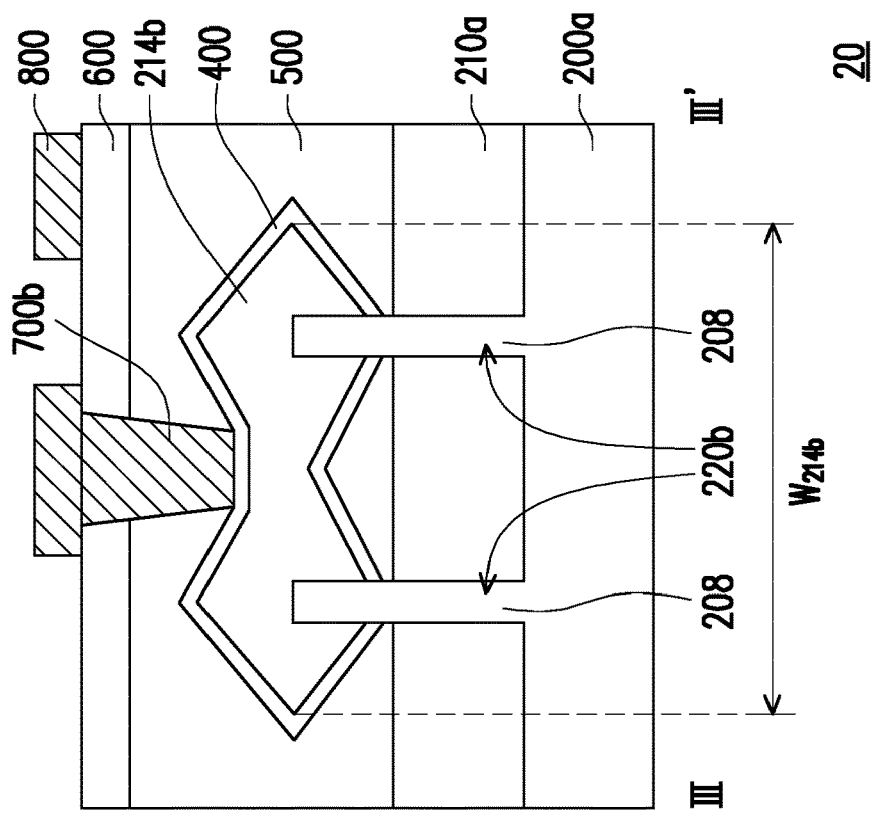
FIG. 8 is a cross-sectional view of a FET in accordance with some alternative embodiments of the disclosure.
Figure 8:
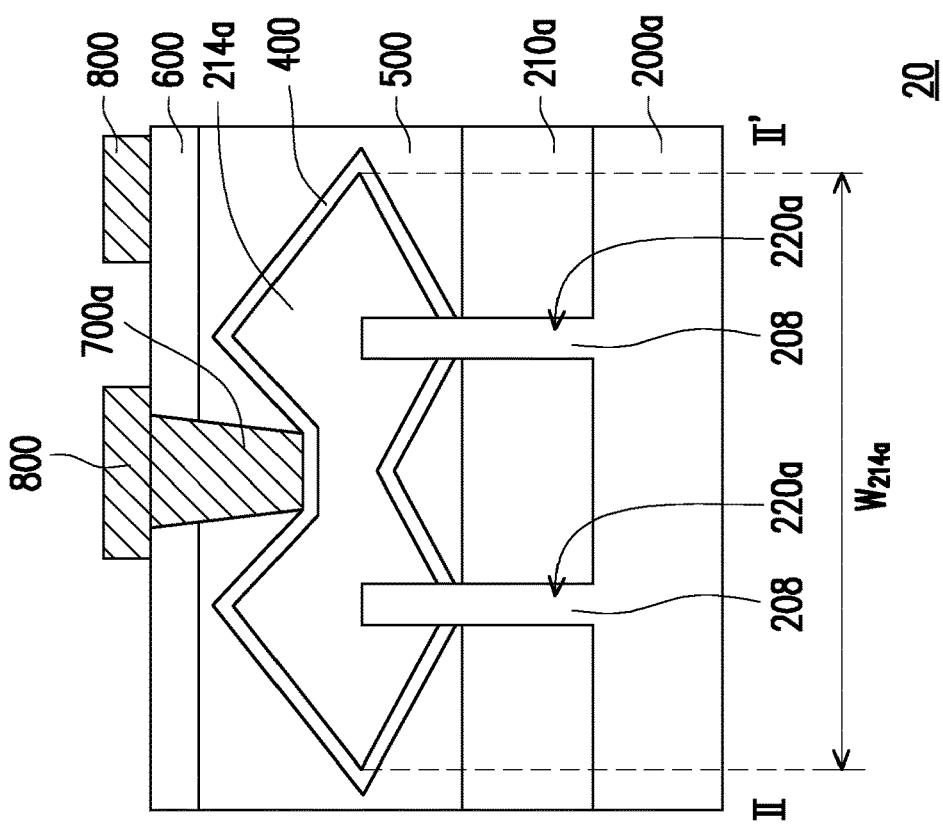

FIG. 8 is a cross-sectional view of a FET 20 in accordance with some alternative embodiments of the disclosure. In FIG. 8, FinFET is being adapted as an exemplary illustration for the FET 20. However, it should be understood that the disclosure is not limited thereto. In some alternative embodiments, the FET 20 may include planar MOSFET (Metal-Oxide-Semiconductor Field-Effect Transistor), Gate-all-around (GAA) FET, or other suitable transistors. Referring to FIG. 8, the FET 20 is similar to the FET 10 shown in FIG. 6N, so similar elements are denoted by similar reference numerals and the detailed descriptions thereof are omitted herein. The difference between the FET 20 of FIG. 8 and the FET 10 of FIG. 6N lies in that in the FET 20 of FIG. 8, the first conductive via 700a and the second conductive via 700b have substantially the same size while the first strained material 214a and the second strained material 214b have different sizes. In other words, the first conductive via 700a and the second conductive via 700b are symmetrical while the first strained material 214a and the second strained material 214b are asymmetrical. As illustrated in FIG. 8, a layout area of the first strained material 214a is larger than a layout area of the second strained material 214b. The layout area may refer to the area occupied by the first strained material 214a and the second strained material 214b in the schematic layout or the top view. For example, a width $W_{214a}$ of the first strained material 214a is larger than a width $W_{214b}$ of the second strained material 214b. In other words, the source may be larger than the drain. As such, larger contact window (landing area) may be provided for the first conductive via 700a. On the other hand, since the drain is smaller, undesired capacitance may be sufficiently reduced, thereby further enhancing the device performance. It should be noted that the configuration shown in FIG. 8 is merely an exemplary illustration, and the disclosure is not limited thereto. In some alternative embodiments, both of the conductive vias (the first conductive vias 700a and the second conductive vias 700b) and the strained materials (the first strained material 214a and the second strained material 214b) may be asymmetrical. That is, the first conductive vias 700a and the second conductive vias 700b may have different sizes and the first strained material 214a and the second strained material 214b may also have different sizes.

In accordance with some embodiments of the disclosure, a field effect transistor (FET) including a substrate, a plurality of insulators, a gate stack, a first strained material, a second strained material, a first conductive via, a second conductive via, and a silicide layer. The substrate includes a plurality of trenches and at least one semiconductor fin between the trenches. The insulators are in the trenches. The gate stack is disposed over the semiconductor fins and on the insulators. The first strained material is located on one side of the gate stack. The second strained material is located on another side of the gate stack. The first conductive via is electrically connected to the first strained material. The second conductive via is electrically connected to the second strained material. The silicide layer contacts the first strained material and the first conductive via and contacts the second strained material and the second conductive via.

In accordance with some embodiments of the disclosure, a manufacturing method of a field effect transistor (FET) includes at least the following steps. A first schematic layout is obtained. The first schematic layout includes a source region of a semiconductor fin, a drain region of the semiconductor fin, a conductive via region, and a routing pattern region. The conductive via region is not overlapped with the source region, the drain region, and/or the routing pattern region. The first schematic layout is modified to generate a second schematic layout. An electrical connection verification process is performed based on the second schematic layout. The field effect transistor is manufactured based on the second schematic layout.

In accordance with some alternative embodiments of the disclosure, a manufacturing method of a filed effect transistor (FET) includes at least the following steps. A first schematic layout is obtained. The first schematic layout includes a source region of a semiconductor fin, a drain region of the semiconductor fin, a conductive via region, and a routing pattern region. A first electrical connection verification process is performed on the first schematic layout to determine whether the source region and the drain region are electrically connected to the routing pattern region. In response to a first condition when the source region and the drain region are determined to be electrically connected to the routing pattern region based on the first electrical connection verification process, the field effect transistor is manufactured based on the first schematic layout. In response to a second condition when the source region and/or the drain region is determined to be electrically insulated from the routing pattern region based on the first electrical connection verification process, a modification step is performed to modify the first schematic layout to generate a second schematic layout. A second electrical connection verification process is performed on the second schematic layout to determine whether the source region and the drain region is electrically connected to the routing pattern region. The field effect transistor is manufactured based on the second schematic layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a field effect transistor (FET), comprising:
    obtaining a first schematic layout comprising a source region of a semiconductor fin, a drain region of the semiconductor fin, a conductive via region, and a routing pattern region, wherein the conductive via region is not overlapped with the source region, the drain region, and/or the routing pattern region;
    modifying the first schematic layout to generate a second schematic layout;
    performing an electrical connection verification process based on the second schematic layout; and
    manufacturing the field effect transistor based on the second schematic layout.

2. The method according to claim 1, wherein the electrical connection verification process is performed by an electronic design automation (EDA) verification software.

3. The method according to claim 1, wherein the electrical connection verification process is performed by measuring an input and an output based on an electronic design automation (EDA) verification software.

4. The method according to claim 1, the electrical connection verification process comprises:
    determining whether the source region and the drain region are electrically connected to the routing pattern region.

5. The method according to claim 1, wherein the step of modifying the first schematic layout comprises:
    generating a faker contact layer (FCL) on the first schematic layout to obtain the second schematic layout, wherein the faker contact layer is overlapped with both of the source region and the conductive via region and/or both of the drain region and the conductive via region.

6. The method according to claim 5, wherein the faker contact layer is overlapped with one of the source region and the drain region.

7. The method according to claim 5, wherein the faker contact layer is partially overlapped with the source region or the drain region.

8. The method according to claim 5, wherein the faker contact layer is partially overlapped with the conductive via region.

9. A manufacturing method of a field effect transistor (FET), comprising:
    obtaining a first schematic layout comprising a source region of a semiconductor fin, a drain region of the semiconductor fin, a conductive via region, and a routing pattern region;
    performing a first electrical connection verification process on the first schematic layout to determine whether the source region and the drain region are electrically connected to the routing pattern region;
    in response to a first condition when the source region and the drain region are determined to be electrically connected to the routing pattern region based on the first electrical connection verification process, manufacturing the field effect transistor based on the first schematic layout;
    in response to a second condition when the source region and/or the drain region is determined to be electrically insulated from the routing pattern region based on the first electrical connection verification process, performing a modification step to modify the first schematic layout to generate a second schematic layout;
    performing a second electrical connection verification process on the second schematic layout to determine whether the source region and the drain region are electrically connected to the routing pattern region; and
    manufacturing the field effect transistor based on the second schematic layout.

10. The method according to claim 9, wherein
    in response to a third condition when the source region and the drain region are determined to be electrically connected to the routing pattern region based on the second electrical connection verification process, manufacturing the field effect transistor based on the second schematic layout;
    in response to a fourth condition when the source region and/or the drain region is determined to be electrically insulated from the routing pattern region based on the second electrical connection verification process, iteratively performing the modification step until the source region and the drain region are determined to be electrically connected to the routing pattern region.

11. The method according to claim 9, wherein the first electrical connection verification process and the second electrical connection verification process are performed by an electronic design automation (EDA) verification software.

12. The method according to claim 9, wherein the modification step comprises:
    generating a faker contact layer (FCL) on the first schematic layout to obtain the second schematic layout, wherein the source region and the drain region are determined to be electrically connected to the routing pattern region through the faker contact layer.

13. The method according to claim 12, wherein the faker contact layer is electrically connected to one of the source region and the drain region.

14. A manufacturing method of a field effect transistor (FET), comprising:
    obtaining a first schematic layout comprising a source region of a semiconductor fin, a drain region of the semiconductor fin, a conductive via region, and a routing pattern region, wherein the first schematic layout is free of interconnect metal layer region, and the conductive via region is not overlapped with at least one of the source region, the drain region, and the routing pattern region;

generating a faker contact layer (FCL) on the first schematic layout to obtain the second schematic layout, wherein the faker contact layer is overlapped with the source region, the drain region, and the conductive via region;

performing an electrical connection verification process based on the second schematic layout; and manufacturing the field effect transistor based on the second schematic layout.

15. The method according to claim 14, wherein the electrical connection verification process is performed by an electronic design automation (EDA) verification software.

16. The method according to claim 14, the electrical connection verification process comprises:

determining whether the source region and the drain region are electrically connected to the routing pattern region.

17. The method according to claim 14, wherein the faker contact layer is partially overlapped with the source region.

18. The method according to claim 14, wherein the faker contact layer is partially overlapped with the drain region.

19. The method according to claim 14, wherein the faker contact layer is partially overlapped with the conductive via region.

20. The method according to claim 14, wherein the faker contact layer is overlapped with the routing pattern region.

* * * * *